US012670824B2

(12) United States Patent
Su et al.

(10) Patent No.: US 12,670,824 B2
(45) Date of Patent: Jun. 30, 2026

(54) PIXEL STRUCTURE, DRIVING METHOD AND DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Lingdan Bo, Beijing (CN); Yingmeng Miao, Beijing (CN); Yue Yang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 36 days.

(21) Appl. No.: 18/993,444

(22) PCT Filed: Apr. 25, 2024

(86) PCT No.: PCT/CN2024/089687
§ 371 (c)(1),
(2) Date: Jan. 10, 2025

(87) PCT Pub. No.: WO2024/244840
PCT Pub. Date: Dec. 5, 2024

(65) Prior Publication Data
US 2026/0031010 A1 Jan. 29, 2026

(30) Foreign Application Priority Data

May 26, 2023 (CN) .......................... 202310609366.8

(51) Int. Cl.
G09G 5/00 (2006.01)
G09G 3/20 (2006.01)
(Continued)

(52) U.S. Cl.
CPC ............. *G09G 3/20* (2013.01); *H10D 86/441* (2025.01); *H10D 86/60* (2025.01);
(Continued)

(58) Field of Classification Search
CPC ............... G09G 3/3611; G09G 3/3648; G09G 2300/0426; G09G 2300/0452;
(Continued)

(56) References Cited

U.S. PATENT DOCUMENTS 11,948,529 B2 * 4/2024 Liu ...................... G09G 3/3607
2018/0210277 A1 * 7/2018 Wang ..................... H10K 59/38
(Continued)

FOREIGN PATENT DOCUMENTS

CN 102116979 A 7/2011
CN 105206245 A 12/2015
(Continued)

*Primary Examiner* — Joe H Cheng
(74) *Attorney, Agent, or Firm* — WHDA, LLP

(57) ABSTRACT

A pixel structure, a driving method and a display substrate are provided. The pixel structure includes a pixel module, a plurality of gate lines and a plurality of data lines. The pixel module includes subpixels having A colors, where A is an integer greater than or equal to 3. The pixel module includes subpixels arranged in rows and columns, two gate lines are arranged between two adjacent rows of subpixels, two columns of subpixels are arranged between two data lines, and in two columns of subpixels, at least two subpixels having a same color and electrically coupled to the two gate lines are electrically coupled to a same data line. In the present disclosure, an edge is grayish in a case that a ¼ white-block image is displayed, so an abnormality in image quality is not easy to perceive as compared with the related art.

19 Claims, 16 Drawing Sheets

(51) Int. Cl.
    *H10D 86/40*     (2025.01)
    *H10D 86/60*     (2025.01)

(52) U.S. Cl.
    CPC ............... *G09G 2300/0426* (2013.01); *G09G 2300/0452* (2013.01); *G09G 2300/0465* (2013.01); *G09G 2320/0238* (2013.01); *G09G 2320/0242* (2013.01); *G09G 2340/0442* (2013.01)

(58) Field of Classification Search
    CPC ... G09G 2320/0238; G09G 2320/0242; G06G 2340/0442; H10D 86/441; H10D 86/60; G02F 1/1362; G02F 1/136286
    See application file for complete search history.

(56)           References Cited

U.S. PATENT DOCUMENTS

| | | | | |
|---|---|---|---|---|
| 2022/0208063 A1* | 6/2022 | Hong | .................... | G09G 3/3225 |
| 2025/0104663 A1* | 3/2025 | Park | ................. | G02F 1/136286 |

FOREIGN PATENT DOCUMENTS

| | | |
|---|---|---|
| CN | 106918965 A | 7/2017 |
| CN | 107092144 A | 8/2017 |
| CN | 109697967 A | 4/2019 |
| CN | 110174804 A | 8/2019 |
| CN | 111028814 A | 4/2020 |
| CN | 112562561 A | 3/2021 |
| CN | 115019739 A | 9/2022 |
| CN | 115236908 A | 10/2022 |
| CN | 115516370 A | 12/2022 |
| JP | 2009151258 A | 7/2009 |

* cited by examiner

PIXEL STRUCTURE, DRIVING METHOD AND DISPLAY SUBSTRATE

CROSS-REFERENCE TO RELATED APPLICATIONS

This application is the U.S. national phase of PCT Application No. PCT/CN2024/089687 filed on Apr. 25, 2024, which claims a priority of the Chinese patent application No. 202310609366.8 filed on May 26, 2023, each of which is incorporated herein by reference in its entirety for all purposes.

TECHNICAL FIELD

The present disclosure relates to the field of display technology, in particular to a pixel structure, a driving method and a display substrate.

BACKGROUND

In the related art, two gate lines are arranged between two adjacent rows of subpixels, and two columns of subpixels are arranged between two data lines. Data on two adjacent data lines has opposite polarities, and the subpixels coupled to each data line have a same color, so in actual use, the subpixels in the adjacent columns have a same polarity. Due to this polarity distribution, head-shaking patterns easily occur, especially for a display product with a low Pixel Per Inch (PPI). In a case that the two adjacent rows of subpixels are enabled simultaneously, the gate lines at two sides of one row of subpixels are enabled simultaneously, and an edge becomes greenish in a case that a ¼ white-block image is displayed.

SUMMARY

In one aspect, the present disclosure provides in some embodiments a pixel structure, including a pixel module, a plurality of gate lines and a plurality of data lines. The pixel module includes subpixels having A colors, where A is an integer greater than or equal to 3. The pixel module includes subpixels arranged in rows and columns, two gate lines are arranged between two adjacent rows of subpixels, two columns of subpixels are arranged between two data lines, and in two columns of subpixels, at least two subpixels having a same color and electrically coupled to the two gate lines are electrically coupled to a same data line.

In a possible embodiment of the present disclosure, the subpixels in a same column in the pixel module have a same color, and the subpixels in two columns arranged between two data lines have different colors; the pixel structure includes N gate lines and a plurality of data lines, where N is an integer greater than 1; a $(2n)^{th}$ gate line and a $(2n+1)^{th}$ gate line are arranged between an $n^{th}$ row of subpixels and an $(n+1)^{th}$ row of subpixels, where n is a positive integer; and in two columns of subpixels arranged between two adjacent data lines, subpixels that are in adjacent rows and have a same color are electrically coupled to a same data line, at least a part of subpixels in the $n^{th}$ row are electrically coupled to the $(2n)^{th}$ gate line, and at least a part of subpixels in the $(n+1)^{th}$ row are electrically coupled to the $(2n+1)^{th}$ gate line.

In a possible embodiment of the present disclosure, the subpixels in a first row and even-numbered columns are electrically coupled to a first gate line, and the subpixel in the first row and a $(2m)^{th}$ column is electrically coupled to an $m^{th}$ data line, where m is a positive integer; and the subpixels in a last row and the even-numbered columns are electrically coupled to a last gate line, and the subpixel in the last row and the $(2m)^{th}$ column is electrically coupled to the $m^{th}$ data line.

In a possible embodiment of the present disclosure, the subpixels in a same column in the pixel module have a same color, and the subpixels in two columns arranged between two data lines have different colors; the pixel structure includes N gate lines and a plurality of data lines, where N is an integer greater than 1; a $(2n)^{th}$ gate line and a $(2n+1)^{th}$ gate line are arranged between an $n^{th}$ row of subpixels and an $(n+1)^{th}$ row of subpixels, where n is a positive integer; in the subpixels arranged between a $(3b-2)^{th}$ data line and a $(3b-1)^{th}$ data line, the subpixels in a same row are electrically coupled to a same gate line, and the subpixels in a same row are electrically coupled to the $(3b-2)^{th}$ data line and the $(3b-1)^{th}$ data line respectively; in the subpixels arranged between a $(3b)^{th}$ data line and a $(3b+1)^{th}$ data line, the subpixels in a same row are electrically coupled to a same gate line, and the subpixels in a same row are electrically coupled to the $(3b)^{th}$ data line and the $(3b+1)^{th}$ data line respectively; and in the subpixels arranged between the $(3b-1)^{th}$ data line and the $(3b)^{th}$ data line, the subpixels in a same row are electrically coupled to different gate lines, and the subpixels in a same row are electrically coupled to the $(3b-1)^{th}$ data line and the $(3b)^{th}$ data line respectively, where b is a positive integer.

In a possible embodiment of the present disclosure, the subpixels in a $(2c-1)^{th}$ row arranged between the $(3b-2)^{th}$ data line and the $(3b-1)^{th}$ data line are electrically coupled to a $(4c-3)^{th}$ gate line, where c is a positive integer; and the subpixels in a $(2c)^{th}$ row arranged between the $(3b-2)^{th}$ data line and the $(3b-1)^{th}$ data line are electrically coupled to a $(4c)^{th}$ gate line.

In a possible embodiment of the present disclosure, in the subpixels in a $(2c-1)^{th}$ row arranged between the $(3b-1)^{th}$ data line and the $(3b)^{th}$ data line, the subpixel in an odd-numbered column is electrically coupled to a $(4c-3)^{th}$ gate line, and the subpixel in an even-numbered column is electrically coupled to a $(4c-2)^{th}$ gate line, where c is a positive integer; and in the subpixels in a $(2c)^{th}$ row arranged between a $(4b-2)^{th}$ data line and a $(4b-1)^{th}$ data line, the subpixel in an odd-numbered column is electrically coupled to the $(4b-1)^{th}$ data line and a $(4c)^{th}$ gate line, and the subpixel in an even-numbered column is electrically coupled to the $(4b-2)^{th}$ data line and a $(4c-1)^{th}$ gate line.

In a possible embodiment of the present disclosure, the subpixels in a $(2c-1)^{th}$ row arranged between the $(3b)^{th}$ data line and the $(3b+1)^{th}$ data line are electrically coupled to a $(4c-2)^{th}$ gate line, and the subpixels in a $(2c)^{th}$ row arranged between the $(3b)^{th}$ data line and the $(3b+1)^{th}$ data line are electrically coupled to a $(4c-1)^{th}$ gate line, where c is a positive integer.

In a possible embodiment of the present disclosure, the subpixels in a same column in the pixel module have a same color, and the subpixels in two columns arranged between two data lines have different colors; the pixel structure includes N gate lines and a plurality of data lines, where N is an integer greater than 1; an $(8n-6)^{th}$ gate line and an $(8n-5)^{th}$ gate line are arranged between a $(4n-3)^{th}$ row of subpixels and a $(4n-2)^{th}$ row of subpixels, where n is a positive integer; in the subpixels in the $(4n-3)^{th}$ row and the subpixels in the $(4n-2)^{th}$ row, the subpixels that are in a same column and electrically coupled to the $(8n-6)^{th}$ gate line and the $(8n-5)^{th}$ gate line and have a same color are electrically coupled to a same data line; an $(8n-2)^{th}$ gate line and an $(8n-1)^{th}$ gate line are arranged between a $(4n-1)^{th}$ row of subpixels and a $(4n)^{th}$ row of subpixels; and in the subpixels in the $(4n-1)^{th}$ row and the subpixels in the $(4n)^{th}$ row, the subpixels that are in a same column and electrically coupled to the $(8n-2)^{th}$ gate line and the $(8n-1)^{th}$ gate line and have a same color are electrically coupled to a same data line.

In a possible embodiment of the present disclosure, in the subpixels in the $(4n-3)^{th}$ row, two subpixels having different colors are arranged between a $d^{th}$ data line and a $(d+1)^{th}$ data line, one of the two subpixels having different colors is electrically coupled to an $(8n-7)^{th}$ gate line and the $(d+1)^{th}$ data line, and the other of the two subpixels having different colors is electrically coupled to an $(8n-6)^{th}$ gate line and the $(d+1)^{th}$ data line, where d is a positive integer.

In a possible embodiment of the present disclosure, an $(8n-4)^{th}$ gate line and an $(8n-3)^{th}$ gate line are arranged between the $(4n-2)^{th}$ row of subpixels and the $(4n-1)^{th}$ row of subpixels; and in the subpixels in the $(4n-2)^{th}$ row, two subpixels having different colors are arranged between a $d^{th}$ data line and a $(d+1)^{th}$ data line, one of the two subpixels having different colors is electrically coupled to the $(8n-4)^{th}$ gate line and the $(d+1)^{th}$ data line, and the other of the two subpixels having different colors is electrically coupled to the $(8n-3)^{th}$ gate line and the $(d+1)^{th}$ data line, where d is a positive integer.

In a possible embodiment of the present disclosure, an $(8n-4)^{th}$ gate line and an $(8n-3)^{th}$ gate line are arranged between the $(4n-2)^{th}$ row of subpixels and the $(4n-1)^{th}$ row of subpixels; and in the subpixels in the $(4n-1)^{th}$ row, two subpixels having different colors are arranged between a $d^{th}$ data line and a $(d+1)^{th}$ data line, one of the two subpixels having different colors is electrically coupled to the $d^{th}$ data line and the $(8n-2)^{th}$ gate line, and the other of the two subpixels having different colors is electrically coupled to the $d^{th}$ data line and the $(8n-3)^{th}$ gate line, where d is a positive integer.

In a possible embodiment of the present disclosure, in the subpixels in the $(4n)^{th}$ row, two subpixels having different colors are arranged between a $d^{th}$ data line and a $(d+1)^{th}$ data line, one of the two subpixels having different colors is electrically coupled to an $(8n-1)^{th}$ gate line and the $d^{th}$ data line, and the other of the two subpixels having different colors is electrically coupled to an $(8n)^{th}$ gate line and the $d^{th}$ data line, where d is a positive integer.

In a possible embodiment of the present disclosure, the pixel structure further includes a gate line arranged at a first side of a first row of subpixels and a gate line arranged at a second side of a last row of subpixels, the first side is a side of the first row of subpixels distal to a second row of subpixels, the second side is a side of the last row of subpixels distal to a second last row of subpixels, and the first side is opposite to the second side.

In a possible embodiment of the present disclosure, the subpixels in a $(3a-2)^{th}$ column are subpixels having a first color, the subpixels in a $(3a-1)^{th}$ column are subpixels having a second color, and the subpixels in a $(3a)^{th}$ column are subpixels having a third color, where a is a positive integer; or the subpixels in the $(3a-2)^{th}$ column are subpixels having the third color, the subpixels in the $(3a-1)^{th}$ column are subpixels having the second color, and the subpixels in the $(3a)^{th}$ column are subpixels having the first color; or the subpixels in the $(3a-2)^{th}$ column are subpixels having the first color, the subpixels in the $(3a-1)^{th}$ column are subpixels having the third color, and the subpixels in the $(3a)^{th}$ column are subpixels having the second color.

In a possible embodiment of the present disclosure, the subpixel includes a pixel electrode and a switching transistor, a gate electrode of the switching transistor is electrically coupled to a corresponding gate line, a first electrode of the switching transistor is electrically coupled to a corresponding data line, and a second electrode of the switching transistor is electrically coupled to the pixel electrode.

In another aspect, the present disclosure provides in some embodiments a driving method for the above-mentioned pixel structure, including simultaneously enabling two gate lines arranged between two adjacent rows of subpixels, so as to control the subpixels electrically coupled to the two gate lines to receive a data voltage on a corresponding data line.

In a possible embodiment of the present disclosure, the two gate lines between two adjacent rows of subpixels form a gate line group, and a plurality of gate line groups is enabled sequentially to control the subpixel to receive the data voltage on the corresponding data line.

In a possible embodiment of the present disclosure, the driving method includes enabling at least a part of rows of subpixels to display a black image, and enabling at least a part of columns of subpixels to display the black image. At least one row of subpixels adjacent to a row of subpixels for displaying the black image include a subpixel for displaying the black image and subpixels for displaying at least three colors.

In a possible embodiment of the present disclosure, the subpixels for displaying at least three colors are subpixels adjacent to each other, or the subpixel for displaying the black image is arranged between the subpixels adjacent to each other in the subpixels for displaying at least three colors.

In yet another aspect, the present disclosure provides in some embodiments a display substrate including the above-mentioned pixel structure.

DETAILED DESCRIPTION OF THE EMBODIMENTS

Figure 1:
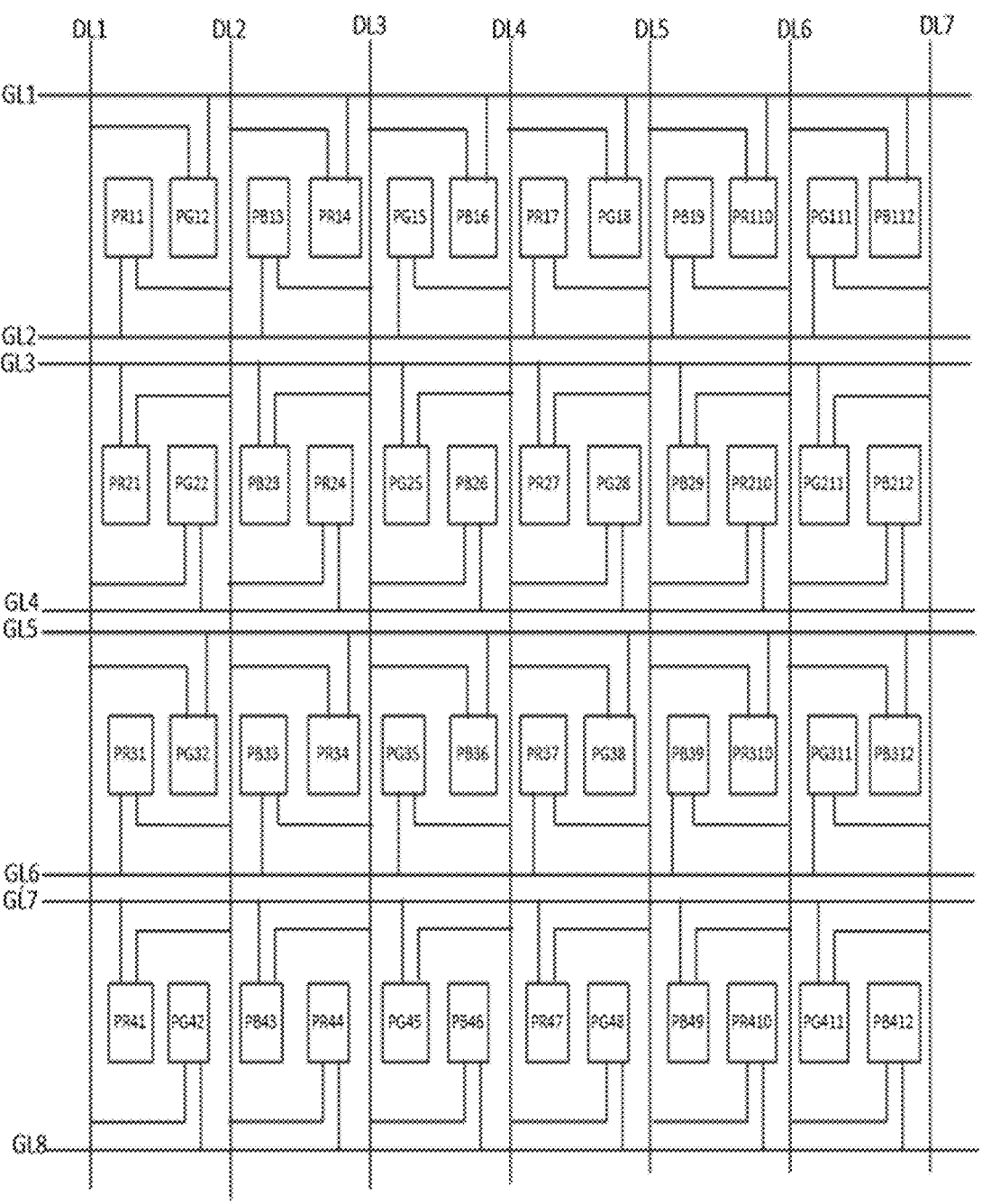
FIG. 1 is a structural view of a pixel structure according to at least one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be thin film transistors, field effect transistors or any other elements having an identical characteristic. In order to differentiate two electrodes other than a gate electrode from each other, one of the two electrodes is called as first electrode and the other is called as second electrode.

In actual use, in a case that the transistor is a thin film transistor or a field effect transistor, the first electrode may be a drain electrode and the second electrode may be a source electrode, or the first electrode may be a source electrode and the second electrode may be a drain electrode.

The present disclosure provides in some embodiments a pixel structure, which includes a pixel module, a plurality of gate lines and a plurality of data lines. The pixel module includes subpixels having A colors, where A is an integer greater than or equal to 3. The pixel module includes subpixels arranged in rows and columns, two gate lines are arranged between two adjacent rows of subpixels, two columns of subpixels are arranged between two data lines, and in two columns of subpixels, at least two subpixels having a same color and electrically coupled to the two gate lines are electrically coupled to a same data line.

In the related art, two gate lines are arranged between two adjacent rows of subpixels, and two columns of subpixels are arranged between two data lines. Data on two adjacent data lines has opposite polarities, and the subpixels having a same color are coupled to each of data lines, so in actual use, the subpixels in the adjacent columns have a same polarity. Due to this polarity distribution, head-shaking patterns easily occur, especially for a display product with a low PPI. In a Digital Line Graphic (DLG) mode, the gate lines at two sides of one row of subpixels are enabled simultaneously, and an edge becomes greenish in a case that a ¼ white-block image is displayed. Based on the above, the present disclosure provides in some embodiments the pixel structure, the pixel module includes the subpixels arranged in rows and columns, two gate lines are arranged between two adjacent rows of subpixels, two columns of subpixels are arranged between two data lines, and in two columns of subpixels, at least two subpixels having a same color and electrically coupled to the two gate lines are electrically coupled to a same data line. In a case that the subpixels in a same column in the pixel module have a same color, switching transistors in the subpixels in a same color driven by the two gate lines between the two adjacent rows of subpixels are designed in a back-to-back manner. In a case that the DLG mode is enabled, a first gate line is enabled separately, and two gate lines between the two adjacent rows of subpixels are enabled simultaneously. In this way, the edge becomes grayish in a case that the ¼ white-block image is displayed, and this abnormality in the image quality is not easy to perceive as compared with the related art.

In at least one embodiment of the present disclosure, the DLG mode refers to a mode where two gate lines are enabled so that a same data voltage is applied to two subpixels driven by the two gate lines and electrically coupled to a same data line.

The DLG mode is a mode where a resolution of a panel is compressed through timing control to achieve a high refresh rate for an image.

In at least one embodiment of the present disclosure, the subpixel includes a pixel electrode and a switching transistor, a gate electrode of the switching transistor is electrically coupled to a corresponding gate line, a first electrode of the switching transistor is electrically coupled to a corresponding data line, and a second electrode of the switching transistor is electrically coupled to the pixel electrode.

In at least one embodiment of the present disclosure, the subpixels in a same column in the pixel module have a same color, and the subpixels in two columns arranged between two data lines have different colors. The pixel structure includes N gate lines and a plurality of data lines, where N is an integer greater than 1. A $(2n)^{th}$ gate line and a $(2n+1)^{th}$ gate line are arranged between an $n^{th}$ row of subpixels and an $(n+1)^{th}$ row of subpixels, where n is a positive integer. In two columns of subpixels arranged between two adjacent data lines, subpixels that are in adjacent rows and have a same color are electrically coupled to a same data line, at least a part of subpixels in the $n^{th}$ row are electrically coupled to the $(2n)^{th}$ gate line, and at least a part of subpixels in the $(n+1)^{th}$ row are electrically coupled to the $(2n+1)^{th}$ gate line.

During the implementation, in the pixel module, the subpixels in a same column have a same color, and the subpixels in two columns between two data lines have different colors. In two columns of subpixels arranged between two adjacent data lines, the subpixels having a same color are electrically coupled to a same data line, at least a part of subpixels in adjacent rows are electrically coupled to one gate line between the adjacent rows of subpixels, and at least a part of subpixels in adjacent rows are electrically coupled to the other gate line between the adjacent rows of subpixels.

In a possible embodiment of the present disclosure, the subpixels in a first row and even-numbered columns are electrically coupled to a first gate line, and the subpixel in the first row and a $(2m)^{th}$ column is electrically coupled to an $m^{th}$ data line, where m is a positive integer. The subpixels in a last row and the even-numbered columns are electrically coupled to a last gate line, and the subpixel in the last row and the $(2m)^{th}$ column is electrically coupled to the $m^{th}$ data line.

In at least one embodiment of the present disclosure, the pixel structure further includes a gate line arranged at a first side of the first row of subpixels and a gate line arranged at a second side of the last row of subpixels. The first side is a side of the first row of subpixels distal to a second row of subpixels, the second side is a side of the last row of subpixels distal to a second last row of subpixels, and the first side is opposite to the second side.

As shown in FIG. 1, the pixel structure in at least one embodiment of the present disclosure includes a pixel module, a plurality of gate lines and a plurality of data line. The pixel module includes subpixels having three colors, i.e., red subpixels, green subpixels and blue subpixels. The pixel module includes the subpixels arranged in rows and columns.

In at least one embodiment of the present disclosure, GL1 represents a first gate line, GL2 represents a second gate line, GL3 represents a third gate line, GL4 represents a fourth gate line, GL5 represents a fifth gate line, GL6 represents a sixth gate line, GL7 represents a seventh gate line, GL8 represents an eighth gate line, DL1 represents a first data line, DL2 represents a second data line, DL3 represents a third data line, DL4 represents a fourth data line, DL5 represents a fifth data line, DL6 represents a sixth data line, and DL7 represents a seventh data line.

FIG. 1 shows the subpixels in a first row, a second row, a third row and a fourth row in the pixel module.

In FIG. 1, PR11 represents a red subpixel in the first row and a first column, PG12 represents a green subpixel in the first row and a second row, PB13 represents a blue subpixel in the first row and a third column, PR14 represents a red subpixel in the first row and a fourth column, PG15 represents a green subpixel in the first row and a fifth column, PB16 represents a blue subpixel in the first row and a sixth column, PR17 represents a red subpixel in the first row and a seventh column, PG18 represents an eight green subpixel in the first row and an eighth column, PB19 represents a blue subpixel in the first row and a ninth column, PR110 represents a red subpixel in the first row and a tenth column, PG111 represents a green subpixel in the first row and an eleventh column, and PB112 represents a blue subpixel in the first row and a twelfth column.

PR21 represents a red subpixel in a second row and the first column, PG22 represents a green subpixel in the second row and the second column, PB23 represents a blue subpixel in the second row and the third column, PR24 represents a red subpixel in the second row and the fourth column, PG25 represents a green subpixel in the second row and the fifth column, PB26 represents a blue subpixel in the second row and the sixth column, PR27 represents a red subpixel in the second row and the seventh column, PG28 represents a green subpixel in the second row and the eighth column, PB29 represents a blue subpixel in the second row and the ninth column, PR210 represents a red subpixel in the second row and the tenth column, PG211 represents a green subpixel in the second row and the eleventh column, and PB212 represents a blue subpixel in the second row and the twelfth column.

PR31 represents a red subpixel in a third row and the first column, PG32 represents a green subpixel in the third row and the second column, PB33 represents a blue subpixel in the third row and the third column, PR34 represents a red subpixel in the third row and the fourth column, PG35 represents a green subpixel in the third row and the fifth column, PB36 represents a blue subpixel in the third row and the sixth column, PR37 represents the red subpixel in the third row and the seventh column, PG38 represents the green subpixel in the third row and the eighth column, PB39 represents a blue subpixel in the third row and the ninth column, PR310 represents a red subpixel in the third row and the tenth column, PG311 represents a green subpixel in the third row and the eleventh column, and PB312 represents a blue subpixel in the third row and the twelfth column.

PR41 represents a red subpixel in a fourth row and the first column, PG42 represents a green subpixel in the fourth row and the second column, PB43 represents a blue subpixel in the fourth row and the third column, PR44 represents a red subpixel in the fourth row and the fourth column, PG45 represents a green subpixel in the fourth row and the fifth column, PB46 represents a blue subpixel in the fourth row and the sixth column, PR47 represents a red subpixel in the fourth row and the seventh column, PG48 represents a green subpixel in the fourth row and the eighth column, PB49 represents a blue subpixel in the fourth row and the ninth column, PR410 represents a red subpixel in the fourth row and the tenth column, PG411 represents a green subpixel in the fourth row and the eleventh column, and PB412 represents a blue subpixel in the fourth row and the twelfth column.

The first gate line GL1 is arranged above the first row of subpixels, the second gate line GL2 and the third gate line GL3 are arranged between the first row of subpixels and the second row of subpixels, the fourth gate line GL4 and the fifth gate line GL5 are arranged between the second row of subpixel and the third row of subpixel, the sixth gate line GL6 and the seventh gate line GL7 are arranged between the third row of subpixels and the fourth row of subpixels, and the eighth gate line GL8 is arranged below the fourth row of subpixels.

The first column of subpixels and the second column of subpixels are arranged between DL1 and DL2, the third column of subpixels and the fourth column of subpixels are arranged between DL2 and DL3, the fifth column of subpixels and the sixth column of subpixels are arranged between DL3 and DL4, the seventh column of subpixels and the eighth column of subpixels are arranged between DL4 and DL5, the ninth column of subpixels and the tenth column of subpixels are arranged between DL5 and DL6, and the eleventh column of subpixels and the twelfth column of subpixels are arranged between DL5 and DL6.

As shown in FIG. 1, PR11 is electrically coupled to GL2 and DL2, PG12 is electrically coupled to GL1 and DL1, PB13 is electrically coupled to GL2 and DL3, PR14 is electrically coupled to GL1 and DL2, PG15 is electrically coupled to GL2 and DL4, PB16 is electrically coupled to GL1 and DL3, PR17 is electrically coupled to GL2 and DL5, PG18 is electrically coupled to GL1 and DL4, PB19 is electrically coupled to GL2 and DL5, PR110 is electrically coupled to GL1 and DL5, PG111 is electrically coupled to GL2 and DL7, and PB112 is electrically coupled to GL1 and DL6.

PR21 is electrically coupled to GL3 and DL1, PG22 is electrically coupled to GL4 and DL1, PB23 is electrically coupled to GL3 and DL3, and so on.

PR31 is electrically coupled to GL5 and DL2, PG32 is electrically coupled to GL6 and DL1, PB33 is electrically coupled to GL6 and DL3, and so on.

PR41 is electrically coupled to GL7 and DL2, PG42 is electrically coupled to GL8 and DL1, PB43 is electrically coupled to GL6 and DL3, PR44 is electrically coupled to GL5 and DL2, and so on.

On the basis of the pixel structure in FIG. 1, each subpixel includes a pixel electrode and a switching transistor.

Figure 2:
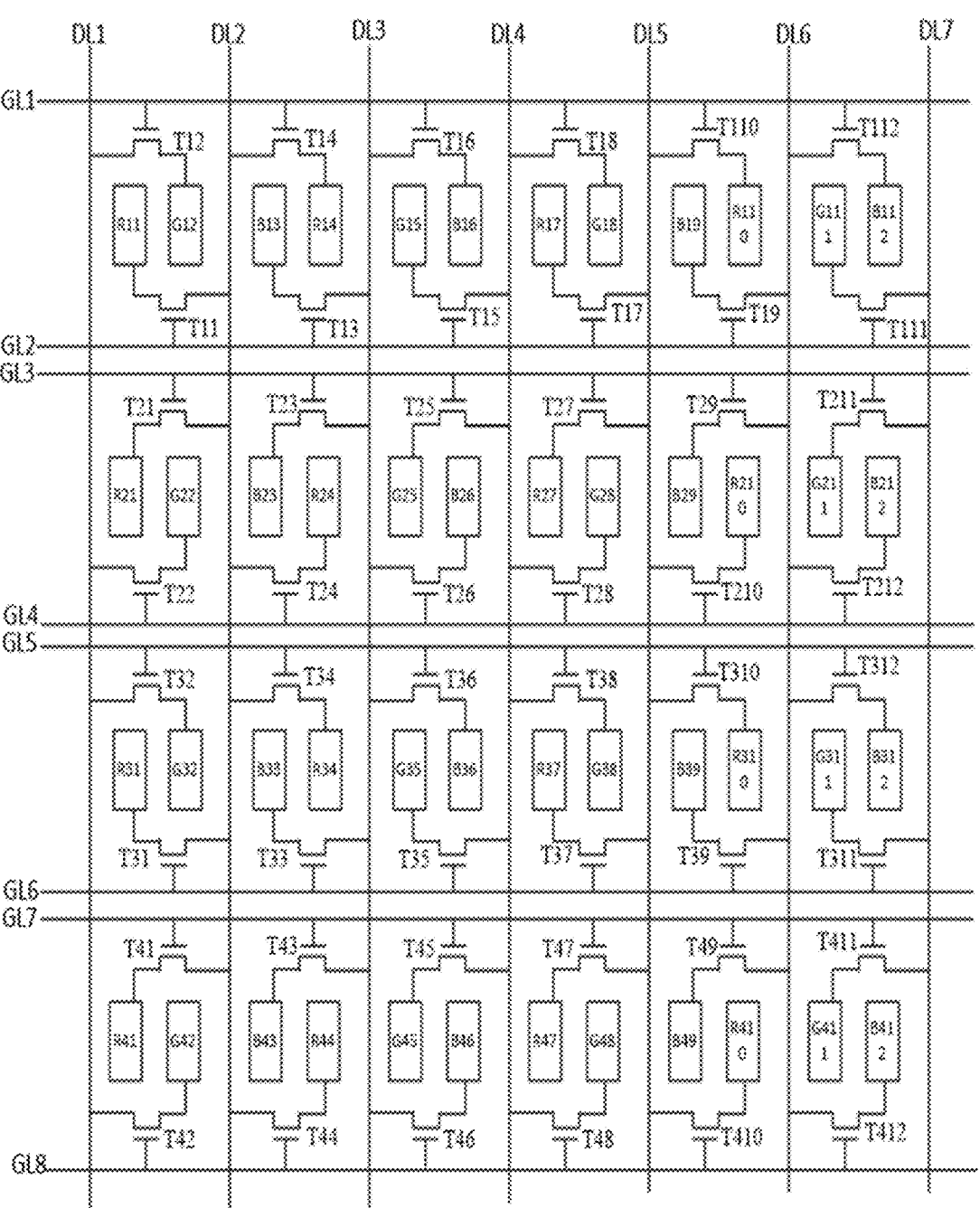
FIG. 2 is a structural view of the pixel structure according to at least one embodiment of the present disclosure.

As shown in FIG. 2, the red subpixel in the first row and the first column includes a red pixel electrode R11 in the first row and the first column and a switching transistor T11 in the first row and the first column. A gate electrode of T11 is electrically coupled to GL2, a source electrode of T11 is electrically coupled to DL2, and a drain electrode of T11 is electrically coupled to R11.

The green subpixel in the first row and the second column includes a green pixel electrode G12 in the first row and the second column and a switching transistor T12 in the first row and the second column. A gate electrode of T12 is electrically coupled to GL1, a source electrode of T12 is electrically coupled to DL1, and a drain electrode of T12 is electrically coupled to G12.

The blue subpixel in the first row and the third column includes a blue pixel electrode B13 in the first row and the third column and a switching transistor T13 in the first row and the third column. A gate electrode of T13 is electrically coupled to GL2, a source electrode of T13 is electrically coupled to DL3, and a drain electrode of T13 is electrically coupled to B13.

The red subpixel in the first row and the fourth column includes a red subpixel electrode R14 in the first row and the fourth column and a switching transistor T14 in the first row and the fourth column. A gate electrode of T14 is electrically coupled to GL1, a source electrode of T14 is electrically coupled to DL2, and a drain electrode of T14 is electrically coupled to R14.

The green subpixel in the first row and the fifth column includes a green pixel electrode G15 in the first row and the fifth column and a switching transistor T15 in the first row and the fifth column. A gate electrode of T15 is electrically coupled to GL2, a source electrode of T15 is electrically coupled to DL4, and a drain electrode of T15 is electrically coupled to G15.

The blue subpixel in the first row and the sixth column includes a blue pixel electrode B16 in the first row and the sixth column and a switching transistor in the first row and the sixth column. A gate electrode of T6 is electrically coupled to GL1, a source electrode of T16 is electrically coupled to DL3, and a drain electrode of T16 is electrically coupled to B16.

The red subpixel in the first row and the seventh column includes a red pixel electrode R17 in the first row and the seventh column and a switching transistor T17 in the first row and the seventh column. A gate electrode of T17 is electrically coupled to GL2, a source electrode of T17 is electrically coupled to DL5, and a drain electrode of T17 is electrically coupled to R17.

The green subpixel in the first row and the eighth column includes a green pixel electrode G18 in the first row and the eighth column and a switching transistor T18 in the first row and the eighth column. A gate electrode of T18 is electrically coupled to GL1, a source electrode of T18 is electrically coupled to DL4, and a drain electrode of T18 is electrically coupled to G18.

The blue subpixel in the first row and the ninth column includes a blue pixel electrode B19 in the first row and the ninth column and a switching transistor T19 in the first row and the ninth column. A gate electrode of T19 is electrically coupled to GL2, a source electrode of T19 is electrically coupled to DL6, and a drain electrode of T19 is electrically coupled to B19.

The red subpixel in the first row and the tenth column includes a red pixel electrode R110 in the first row and the tenth column and a switching transistor T110 in the first row and the tenth column. A gate electrode of T110 is electrically coupled to GL1, a source electrode of T110 is electrically coupled to DL5, and a drain electrode of T110 is electrically coupled to R110.

The green subpixel in the first row and the eleventh column includes a green pixel electrode G111 in the first row and the eleventh column and a switching transistor T111 in the first row and the eleventh column. A gate electrode of T111 is electrically coupled to GL2, a source electrode of T111 is electrically coupled to DL7, and a drain electrode of T111 is electrically coupled to G111.

The blue subpixel in the first row and the twelfth column includes a blue subpixel electrode B112 in the first row and the twelfth column and a switching transistor T112 in the first row and the twelfth column. A gate electrode of T112 is electrically coupled to GL1, a source electrode of T112 is electrically coupled to DL6, and a drain electrode of T112 is electrically coupled to B112.

The red subpixel in the second row and the first column includes a red pixel electrode R21 in the second row and the first column and a switching transistor T21 in the second row and the first column. A gate electrode of T21 is electrically coupled to GL3, a source electrode of T21 is electrically coupled to DL2, and a drain electrode of T21 is electrically coupled to R21.

The green subpixel in the second row and the second column includes a green pixel electrode G22 in the second row and the second column and a switching transistor T22 in the second row and the second column. A gate electrode of T22 is electrically coupled to GL4, a source electrode of T22 is electrically coupled to DL1, and a drain electrode of T22 is electrically coupled to G22.

The blue subpixel in the second row and the third column includes a blue pixel electrode B23 in the second row and the third column and a switching transistor T23 in the second row and the third column. A gate electrode of T23 is electrically coupled to GL3, a source electrode of T23 is electrically coupled to DL3, and a drain electrode of T23 is electrically coupled to B23.

The red subpixel in the second row and the fourth column includes a red pixel electrode R24 in the second row and the fourth column and a switching transistor T24 in the second row and the fourth column. A gate electrode of T24 is electrically coupled to GL4, a source electrode of T14 is electrically coupled to DL2, and a drain electrode of T24 is electrically coupled to R24.

In FIG. 2, G25 represents a green pixel electrode in the second row and the fifth column, B26 represents a blue pixel electrode in the second row and the sixth column, R27 represents a red pixel electrode in the second row and the seventh column, G28 represents a green pixel in the second row and the eighth column, B29 represents a blue pixel electrode in the second row and the ninth column, R210 represents a red pixel electrode in the second row and the tenth column, G211 represents a green pixel electrode in the second row and the eleventh column, and B212 represents a blue pixel electrode in the second row and the twelfth column.

In at least one embodiment of the present disclosure, T25 represents a switching transistor in the second row and the fifth column, T26 represents a switching transistor in the second row and the sixth column, T27 represents a switching transistor in the second row and the seventh column, T28 represents a switching transistor in the second row and the eighth column, T29 represents a switching transistor in the second row and the ninth column, T210 represents a switching transistor in the second row and the tenth column, T211 represents a switching transistor in the second row and the eleventh column, and T212 represents a switching transistor in the second row and the twelfth column.

A gate electrode of T212 is electrically coupled to GL4, a source electrode of T212 is electrically coupled to DL6, and a drain electrode of T212 is electrically coupled to B212.

The red subpixel in the third row and the first column includes a red pixel electrode R31 in the third row and the first column and a switching transistor T31 in the third row and the first column. A gate electrode of T31 is electrically coupled to GL6, a source electrode of T31 is electrically coupled to DL2, and a drain electrode of T31 is electrically coupled to R31.

The green subpixel in the third row and the second column includes a green pixel electrode G32 in the third row and the second column and a switching transistor T32 in the third row and the second column. A gate electrode of T32 is electrically coupled to GL5, a source electrode of T32 is electrically coupled to DL1, and a drain electrode of T32 is electrically coupled to G32.

The blue subpixel in the third row and the third column includes a blue pixel electrode B33 in the third row and the third column and a switching transistor T33 in the third row and the third column. A gate electrode of T33 is electrically coupled to GL6, a source electrode of T33 is electrically coupled to DL3, and a drain electrode of T33 is electrically coupled to B33.

As shown in FIG. 2, R34 represents a red pixel electrode in the third row and the fourth column, G35 represents a green pixel electrode in the third row and the fifth column, B36 represents a blue pixel electrode in the third row and the sixth column, R37 represents a red pixel electrode in the third row and the seventh column, G38 represents a green pixel electrode in the third row and the eighth column, B39 represents a blue pixel electrode in the third row and the ninth column, R310 represents a red pixel electrode in the third row and the tenth column, G311 represents a green pixel electrode in the third row and the eleventh column, and B312 represents a blue pixel electrode in the third row and the twelfth column.

In at least one embodiment of the present disclosure, T34 represents a switching transistor in the third row and the fourth column, T35 represents a switching transistor in the third row and the fifth column, T36 represents a switching transistor in the third row and the sixth column, T37 represents a switching transistor in the third row and the seventh column, T38 represents a switching transistor in the third row and the eighth column, T39 represents a switching transistor in the third row and the ninth column, T310 represents a switching transistor in the third row and the tenth column, T311 represents a switching transistor in the third row and the eleventh column, and T312 represents a switching transistor in the third row and the twelfth column.

The red subpixel in the fourth row and the first column includes a red pixel electrode R41 in the fourth row and the first column and a switching transistor T41 in the fourth row and the first column. A gate electrode of T41 is electrically coupled to GL7, a source electrode of T41 is electrically coupled to DL2, and a drain electrode of T41 is electrically coupled to R41.

The green subpixel in the fourth row and the second column includes a green pixel electrode G42 in the fourth row and the second column and a switching transistor T42 in the fourth row and the second column. A gate electrode of T42 is electrically coupled to GL8, a source electrode of T42 is electrically coupled to DL1, and a drain electrode T42 is electrically coupled to G42.

The blue subpixel in the fourth row and the third column includes a blue pixel electrode B43 in the fourth row and the third column and a switching transistor T43 in the fourth row and the third column. A gate electrode of T43 is electrically coupled to GL7, a source electrode of T43 is electrically coupled to DL3, and a drain electrode of T43 is electrically coupled to B43.

As shown in FIG. 2, R44 represents a red pixel electrode in the fourth row and the fourth column, G45 represents a green pixel electrode in the fourth row and the fifth column, B46 represents a blue pixel electrode in the fourth row and the sixth column, R47 represents a red pixel electrode in the fourth row and the seventh column, G48 represents a green pixel electrode in the fourth row and the eighth column, B49 represents a blue pixel electrode in the fourth row and the ninth column, R410 represents a red pixel electrode in the fourth row and the tenth column, G411 represents a green pixel electrode in the fourth row and the eleventh column, and B412 represents a blue pixel electrode in the fourth row and the twelfth column.

In at least one embodiment of the present disclosure, T44 represents a switching transistor in the fourth row and the fourth column, T45 represents a switching transistor in the fourth row and the fifth column, T46 represents a switching transistor in the fourth row and the sixth column, T47 represents a switching transistor in the fourth row and the seventh column, T48 represents a switching transistor in the fourth row and the eighth column, T49 represents a switching transistor in the fourth row and the ninth column, T410 represents a switching transistor in the fourth row and the tenth column, T411 represents a switching transistor in the fourth row and the eleventh column, and T412 represents a switching transistor in the fourth row and the twelfth column.

In the pixel structure as shown in FIG. 2, in two adjacent rows of subpixels, the switching transistors electrically coupled to two gate lines between the two adjacent rows of subpixels form a back-to-back structure.

Figure 3A:
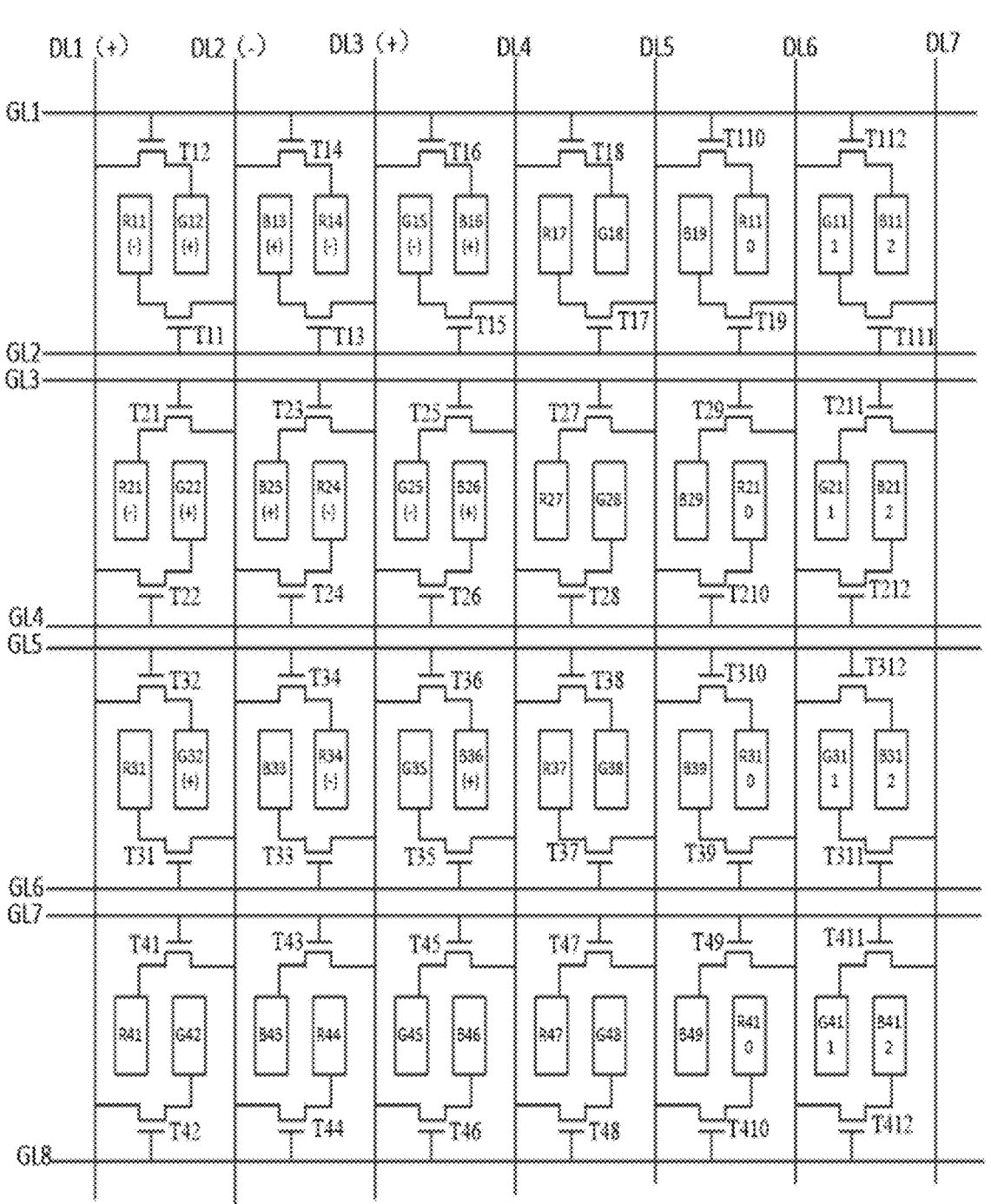
FIG. 3A is a schematic view showing a first operating state of the pixel structure in FIG. 2.

In at least one embodiment of the present disclosure, during the operation of the pixel structure in FIG. 2, in a case that a ¼ white-block image is displayed (in one display image, ¼ of the image is white, and an L0 grayscale data voltage is applied to the other ¾ of the image, i.e., the other ¾ of the image is black; it should be appreciated that, an effect of the present disclosure is described by taking the ¼ white-block image as an example; of course, a ratio of the white image to the entire display image may have any other value, e.g., ⅛ or ⅔, or the white image may be displayed through any subpixels in rows and columns and the black image may be displayed through the adjacent subpixels, and at this time it is also able to improve the display image, which will not be particularly defined herein), it is able to improve the display quality. For example, for the pixel structure in FIG. 2, six subpixels at an upper left corner are used to display a white image. In a DLG mode, as shown in FIG. 3A, in a case that a ¼ white-block image is displayed, it is able to improve the display quality, which will be illustratively described as follows.

In a case that the ¼ white-block image is to be displayed, the first gate line GL1 is scanned, DL1 provides a positive data voltage, DL2 provides a negative data voltage, DL3 provides a positive data voltage, and DL4 provides an L0 grayscale data voltage, so T12, T14 and T16 are turned on, G12 receives a positive data voltage, R14 receives a negative data voltage, and B14 receives a positive data voltage.

Next, GL2 and GL3 are scanned simultaneously (GL2 and GL3 are enabled simultaneously), so T11, T13, T15, T21, T23 and T25 are turned on simultaneously, DL1 provides a positive data voltage, DL2 provides a negative data voltage, DL3 provides a positive data voltage, DL4 provides a negative data voltage, R11 receives a negative data voltage, B13 receives a positive data voltage, G15 receives a negative data voltage, R21 receives a negative data voltage, B23 receives a positive data voltage, and G25 receives a negative data voltage.

Then, GL4 and GL5 are scanned simultaneously, so T22, T24, T26, T32, T34 and T36 are turned on simultaneously, DL1 provides a positive data voltage, DL2 provides a negative data voltage, DL3 provides a positive data voltage, DL4 provides an L0 grayscale data voltage, R11 receives a negative data voltage, B13 receives a positive data voltage, G22 receives a positive data voltage, R24 receives a negative data voltage, B26 receives a positive data voltage, G32 receives a positive data voltage, R34 receives a positive data voltage, and G36 receives a positive data voltage. Here, in a case that the ¼ white-block image is displayed, the positive or negative data voltage is a data voltage which is not an L0 grayscale voltage.

Apart from the subpixels receiving the data voltages, the other subpixels are not in a display state, or an L0 grayscale voltage is applied to these subpixels. For example, GL6 and GL7 are enabled simultaneously, and at this time, DL1, DL2, DL3, DL4, DL5 and DL6 all receive an L0 grayscale voltage, so a black image is displayed.

As shown in FIG. 3A, at an edge of the ¼ white image, the green subpixel in the third row and the second column, the red subpixel in the third row and the fourth column and the blue subpixel in the third row and the sixth column emit light simultaneously, so the edge is grayish. As compared with the related art where a same color is displayed at the edge after the DLG mode is enabled (e.g., the green subpixels emit light at the edge, so the edge of the ¼ white-block image in the DLG mode is greenish), the abnormality in the image quality is not easy to perceive. Hence, according to the embodiments of the present disclosure, it is able to improve the display quality in a case that the DLG mode is enabled.

In at least one embodiment of the present disclosure, in a case that the ¼ white image is displayed, DL5, DL6 and DL7 provide a data voltage corresponding to an L0 grayscale, so that the corresponding subpixels display a black image.

In at least one embodiment of the present disclosure, the L0 grayscale data voltage is just the data voltage corresponding to the L0 grayscale, and the L0 grayscale data voltage is a data voltage corresponding to a black image.

Figure 3B:
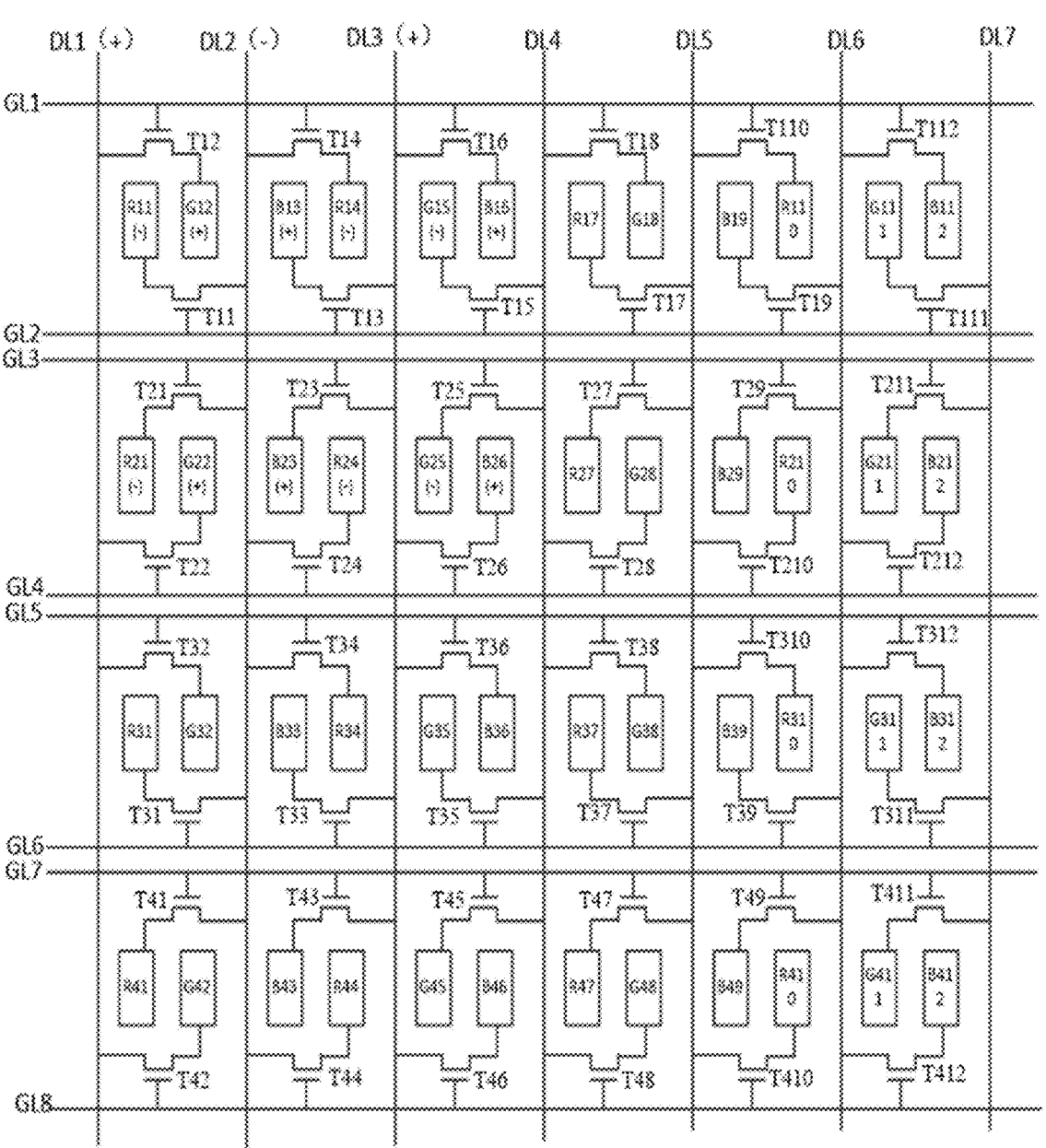
FIG. 3B is a schematic view showing a second operating state of the pixel structure in FIG. 2.

In at least one embodiment of the present disclosure, during the operation of the pixel structure in FIG. 2, in a case that the ¼ white-block image is displayed, i.e., the six subpixels at the upper left corner display an image, the subpixels are enabled row by row in a normal driving mode. As shown in FIG. 3B, in a case that the ¼ white-block image is displayed, the following description will be given.

At first, GL1 is enabled, DL1 provides a positive data voltage, DL2 provides a negative data voltage, DL3 provides a positive data voltage, and DL4 provides an L0 grayscale data voltage, so T12, T14 and T16 are turned on, G12 receives a positive data voltage, R14 receives a negative data voltage, B16 receives a positive data voltage, and DL5, DL6 and DL7 provide an L0 grayscale data voltage.

Next, GL2 is enabled, DL1 provides a positive data voltage, DL2 provides a negative data voltage, DL3 provides a positive data voltage, and DL4 provides a negative data voltage, so T11, T13 and T15 are turned on, R11 receives a negative data voltage, B13 receives a positive data voltage, G15 receives a negative data voltage, and DL5, DL6 and DL7 provide an L0 grayscale data voltage.

Next, GL3 is enabled, DL1 provides a positive data voltage, DL2 provides a negative data voltage, DL3 provides a positive data voltage, and DL4 provides a negative data voltage, so T21, T23 and T25 are turned on, R21 receives a negative data voltage, G23 receives a positive data voltage, G25 receives a negative data voltage, and DL5, DL6 and DL7 provide an L0 grayscale data voltage.

Then, GL4 is enabled, DL1 provides a positive data voltage, DL2 provides a negative data voltage, DL3 provides a positive data voltage, and DL4 provides an L0 grayscale data voltage, so T2, T24 and T25 are turned on, G22 receives a positive data voltage, R24 receives a negative data voltage, B26 receives a positive data voltage, and DL5, DL6 and DL7 provide an L0 grayscale data voltage.

Based on the above, in the normal driving mode, the edge is normal in a case that the ¼ white-block image is displayed.

In at least one embodiment of the present disclosure, the subpixels in a same column in the pixel module have a same color, and the subpixels in two columns arranged between two data lines have different colors. The pixel structure includes N gate lines and a plurality of data lines, where N is an integer greater than 1. A $(2n)^{th}$ gate line and a $(2n+1)^{th}$ gate line are arranged between an $n^{th}$ row of subpixels and an $(n+1)^{th}$ row of subpixels, where n is a positive integer. In the subpixels arranged between a $(3b-2)^{th}$ data line and a $(3b-1)^{th}$ data line, the subpixels in a same row are electrically coupled to a same gate line, and the subpixels in a same row are electrically coupled to the $(3b-2)^{th}$ data line and the $(3b-1)^{th}$ data line respectively. In the subpixels arranged between a $(3b)^{th}$ data line and a $(3b+1)^{th}$ data line, the subpixels in a same row are electrically coupled to a same gate line, and the subpixels in a same row are electrically coupled to the $(3b)^{th}$ data line and the $(3b+1)^{th}$ data line respectively. In the subpixels arranged between the $(3b-1)^{th}$ data line and the $(3b)^{th}$ data line, the subpixels in a same row are electrically coupled to different gate lines, and the subpixels in a same row are electrically coupled to the $(3b-1)^{th}$ data line and the $(3b)^{th}$ data line respectively, where b is a positive integer.

During the implementation, the subpixels in a same column in the pixel module have a same color, and the subpixels in two columns arranged between two data lines have different colors. Two gate lines are arranged between two rows of subpixels. In the subpixels arranged between the $(3b-2)^{th}$ data line and the $(3b-1)^{th}$ data line, the subpixels in a same row are electrically coupled to a same gate line, and the subpixels in a same row are electrically coupled to the $(3b-2)^{th}$ data line and the $(3b-1)^{th}$ data line respectively. In the subpixels arranged between the $(3b)^{th}$ data line and the $(3b+1)^{th}$ data line, the subpixels in a same row are electrically coupled to a same gate line, and the subpixels in a same row are electrically coupled to the $(3b)^{th}$ data line and the $(3b+1)^{th}$ data line respectively. In the subpixels arranged between the $(3b-1)^{th}$ data line and the $(3b)^{th}$ data line, the subpixels in a same row are electrically coupled to different gate lines, and the subpixels in a same row are electrically coupled to the $(3b-1)^{th}$ data line and the $(3b)^{th}$ data line respectively.

In a possible embodiment of the present disclosure, the subpixels in a $(2c-1)^{th}$ row arranged between the $(3b-2)^{th}$ data line and the $(3b-1)^{th}$ data line are electrically coupled to a $(4c-3)^{th}$ gate line, where c is a positive integer. The subpixels in a $(2c)^{th}$ row arranged between the $(3b-2)^{th}$ data line and the $(3b-1)^{th}$ data line are electrically coupled to a $(4c)^{th}$ gate line.

In at least one embodiment of the present disclosure, in the subpixels in a $(2c-1)^{th}$ row arranged between the $(3b-1)^{th}$ data line and the $(3b)^{th}$ data line, the subpixel in an odd-numbered column is electrically coupled to a $(4c-3)^{th}$ gate line, and the subpixel in an even-numbered column is electrically coupled to a $(4c-2)^{th}$ gate line, where c is a positive integer. In the subpixels in a $(2c)^{th}$ row arranged between a $(4b-2)^{th}$ data line and a $(4b-1)^{th}$ data line, the subpixel in an odd-numbered column is electrically coupled to the $(4b-1)^{th}$ data line and a $(4c)^{th}$ gate line, and the subpixel in an even-numbered column is electrically coupled to the $(4b-2)^{th}$ data line and a $(4c-1)^{th}$ gate line.

In a possible embodiment of the present disclosure, the subpixels in a $(2c-1)^{th}$ row arranged between the $(3b)^{th}$ data line and the $(3b+1)^{th}$ data line are electrically coupled to a $(4c-2)^{th}$ gate line, and the subpixels in a $(2c)^{th}$ row arranged between the $(3b)^{th}$ data line and the $(3b+1)^{th}$ data line are electrically coupled to a $(4c-1)^{th}$ gate line, where c is a positive integer.

Figure 4:
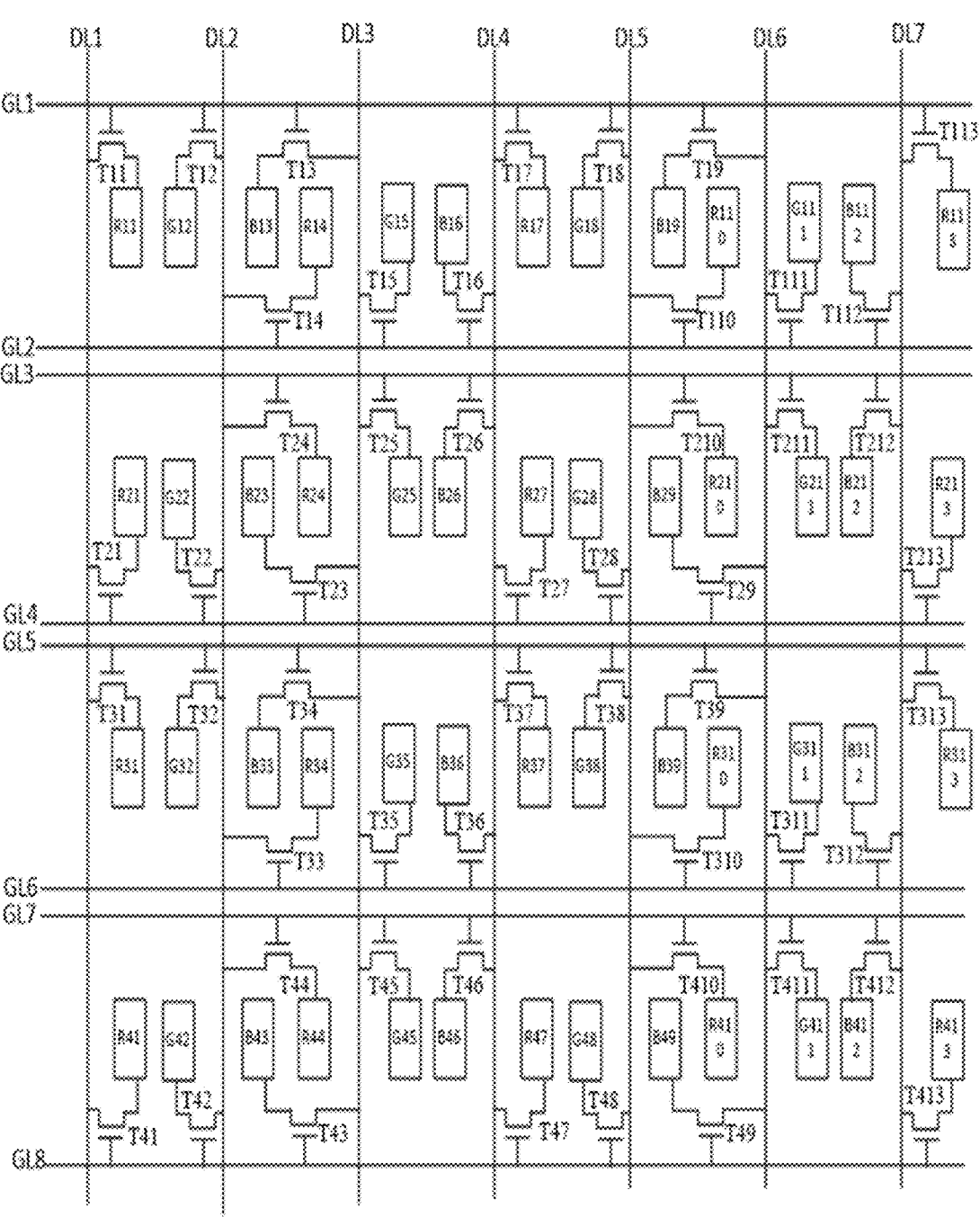
FIG. 4 is a structural view of the pixel structure according to at least one embodiment of the present disclosure.

As shown in FIG. 4, the red subpixel in the first row and the first column includes a red pixel electrode R11 in the first row and the first column and a switching transistor T11 in the first row and the first column. A gate electrode of T11 is electrically coupled to GL1, a source electrode of T11 is electrically coupled to DL1, and a drain electrode of T11 is electrically coupled to R11.

The green subpixel in the first row and the second column includes a green pixel electrode G12 in the first row and the second column and a switching transistor T12 in the first row and the second column. A gate electrode of T12 is electrically coupled to GL1, a source electrode of T12 is electrically coupled to DL2, and a drain electrode of T12 is electrically coupled to G12.

The blue subpixel in the first row and the third column includes a blue pixel electrode B13 in the first row and the third column and a switching transistor T13 in the first row and the third column. A gate electrode of T13 is electrically coupled to GL1, a source electrode of T13 is electrically coupled to DL3, and a drain electrode of T13 is electrically coupled to B13.

The red subpixel in the first row and the fourth column includes a red pixel electrode R14 in the first row and the fourth column and a switching transistor T14 in the first row and the fourth column. A gate electrode of T14 is electrically coupled to GL2, a source electrode of T14 is electrically coupled to DL2, and a drain electrode of T14 is electrically coupled to R14.

The green subpixel in the first row and the fifth column includes a green pixel electrode G15 in the first row and the fifth column and a switching transistor T15 in the first row and the fifth column. A gate electrode of T15 is electrically coupled to GL2, a source electrode of T15 is electrically coupled to DL3, and a drain electrode of T15 is electrically coupled to G15.

The blue subpixel in the first row and the sixth column includes a blue pixel electrode B16 in the first row and the sixth column and a switching transistor T16 in the first row and the sixth column. A gate electrode of T16 is electrically coupled to GL2, a source electrode of T16 is electrically coupled to DL4, and a drain electrode of T16 is electrically coupled to B16.

The red subpixel in the first row and the seventh column includes a red pixel electrode R17 in the first row and the seventh column and a switching transistor T17 in the first row and the seventh column. A gate electrode of T17 is electrically coupled to GL1, a source electrode of T17 is electrically coupled to DL4, and a drain electrode of T17 is electrically coupled to R17.

The green subpixel in the first row and the eighth column includes a green pixel electrode G18 in the first row and the eighth column and a switching transistor T18 in the first row and the eighth column. A gate electrode of T18 is electrically coupled to GL1, a source electrode of T18 is electrically coupled to DL5, and a drain electrode of T18 is electrically coupled to G18.

The blue subpixel in the first row and the ninth column includes a blue pixel electrode B19 in the first row and the ninth column and a switching transistor T19 in the first row and the ninth column. A gate electrode of T19 is electrically coupled to GL1, a source electrode of T19 is electrically coupled to DL6, and a drain electrode of T19 is electrically coupled to B19.

The red subpixel in the first row and the tenth column includes a red pixel electrode R110 in the first row and the tenth column and a switching transistor T110 in the first row and the tenth column. A gate electrode of T110 is electrically coupled to GL2, a source electrode of T110 is electrically coupled to DL5, and a drain electrode of T110 is electrically coupled to R110.

The green subpixel in the first row and the eleventh column includes a green pixel electrode G111 in the first row and the eleventh column and a switching transistor T111 in the first row and the eleventh column. A gate electrode of T111 is electrically coupled to GL2, a source electrode of T111 is electrically coupled to DL6, and a drain electrode of T111 is electrically coupled to G111.

The blue subpixel in the first row and the twelfth column includes a blue pixel electrode B112 in the first row and the twelfth column and a switching transistor T112 in the first row and the twelfth column. A gate electrode of T112 is electrically coupled to GL2, a source electrode of T112 is electrically coupled to DL7, and a drain electrode of T112 is electrically coupled to B112.

The red subpixel in the first row and a thirteenth column includes a red pixel electrode R113 in the first row and the thirteenth column and a switching transistor T113 in the first row and the thirteenth column. A gate electrode of T113 is electrically coupled to GL1, a source electrode of T113 is electrically coupled to DL7, and a drain electrode of T113 is electrically coupled to R113.

The red subpixel in the second row and the first column includes a red pixel electrode R21 in the second row and the first column and a switching transistor T21 in the second row and the first column. A gate electrode of T21 is electrically coupled to GL4, a source electrode of T21 is electrically coupled to DL1, and a drain electrode of T21 is electrically coupled to R21.

The green subpixel in the second row and the second column includes a green pixel electrode G22 in the second row and the second column and a switching transistor T22 in the second row and the second column. A gate electrode of T22 is electrically coupled to GL4, a source electrode of T22 is electrically coupled to DL2, and a drain electrode of T22 is electrically coupled to G22.

The blue subpixel in the second row and the third column includes a blue pixel electrode B23 in the second row and the third column and a switching transistor T23 in the second row and the third column. A gate electrode of T23 is electrically coupled to GL4, a source electrode of T23 is electrically coupled to DL3, and a drain electrode of T23 is electrically coupled to B23.

The red subpixel in the second row and the fourth column includes a red pixel electrode R24 in the second row and the fourth column and a switching transistor T24 in the second row and the fourth column. A gate electrode of T24 is electrically coupled to GL3, a source electrode of T24 is electrically coupled to DL2, and a drain electrode of T24 is electrically coupled to R24.

The green subpixel in the second row and the fifth column includes a green pixel electrode G25 in the second row and the fifth column and a switching transistor T25 in the second row and the fifth column. A gate electrode of T25 is electrically coupled to GL3, a source electrode of T25 is electrically coupled to DL3, and a drain electrode of T25 is electrically coupled to G25.

The blue subpixel in the second row and the sixth column includes a blue pixel electrode B26 in the second row and the sixth column and a switching transistor T26 in the second row and the sixth column. A gate electrode of T26 is electrically coupled to GL3, a source electrode of T26 is electrically coupled to DL4, and a drain electrode of T26 is electrically coupled to B26.

The red subpixel in the second row and the seventh column includes a red pixel electrode R27 in the second row and the seventh column and a switching transistor T27 in the second row and the seventh column. A gate electrode of T27 is electrically coupled to GL4, a source electrode of T27 is electrically coupled to DL4, and a drain electrode of T27 is electrically coupled to R27.

The green subpixel in the second row and the eighth column includes a green pixel electrode G28 in the second row and the eighth column and a switching transistor T28 in the second row and the eighth column. A gate electrode of T28 is electrically coupled to GL4, a source electrode of T28 is electrically coupled to DL5, and a drain electrode of T28 is electrically coupled to G28.

The blue subpixel in the second row and the ninth column includes a blue pixel electrode B29 in the second row and the ninth column and a switching transistor T29 in the second row and the ninth column. A gate electrode of T29 is electrically coupled to GL4, a source electrode of T29 is electrically coupled to DL6, and a drain electrode of T29 is electrically coupled to B29.

The red subpixel in the second row and the tenth column includes a red pixel electrode R210 in the second row and the tenth column and a switching transistor T210 in the second row and the tenth column. A gate electrode of T210 is electrically coupled to GL3, a source electrode of T210 is electrically coupled to DL5, and a drain electrode of T210 is electrically coupled to R210.

The green subpixel in the second row and the eleventh column includes a green pixel electrode G211 in the second row and the eleventh column and a switching transistor T211 in the second row and the eleventh column. A gate electrode of T211 is electrically coupled to GL3, a source electrode of T211 is electrically coupled to DL6, and a drain electrode of T211 is electrically coupled to G211.

The blue subpixel in the second row and the twelfth column includes a blue pixel electrode B212 in the second row and the twelfth column and a switching transistor T212 in the second row and the twelfth column. A gate electrode of T212 is electrically coupled to GL3, a source electrode of T212 is electrically coupled to DL7, and a drain electrode of T212 is electrically coupled to B212.

The red subpixel in the second row and the thirteenth column includes a red pixel electrode R213 in the second row and the thirteenth column and a switching transistor T213 in the second row and the thirteenth column. A gate electrode of T213 is electrically coupled to GL4, a source electrode of T213 is electrically coupled to DL7, and a drain electrode of T213 is electrically coupled to R213.

Referring to FIG. 4, structures of the subpixels in the third row and the fourth row as well as a connection relationship will not be particularly defined herein.

In FIG. 4, R313 represents a red subpixel in the third row and the thirteenth column, T313 represents a switching transistor in the third row and the thirteenth column, R413 represents a red subpixel in the fourth row and the thirteenth column, and T413 represents a switching transistor in the fourth row and the thirteenth column.

In the pixel structure as shown in FIG. 4, in two adjacent rows of subpixels, the switching transistors electrically coupled to two gate lines between the two rows of subpixels form a back-to-back structure.

Figure 5A:
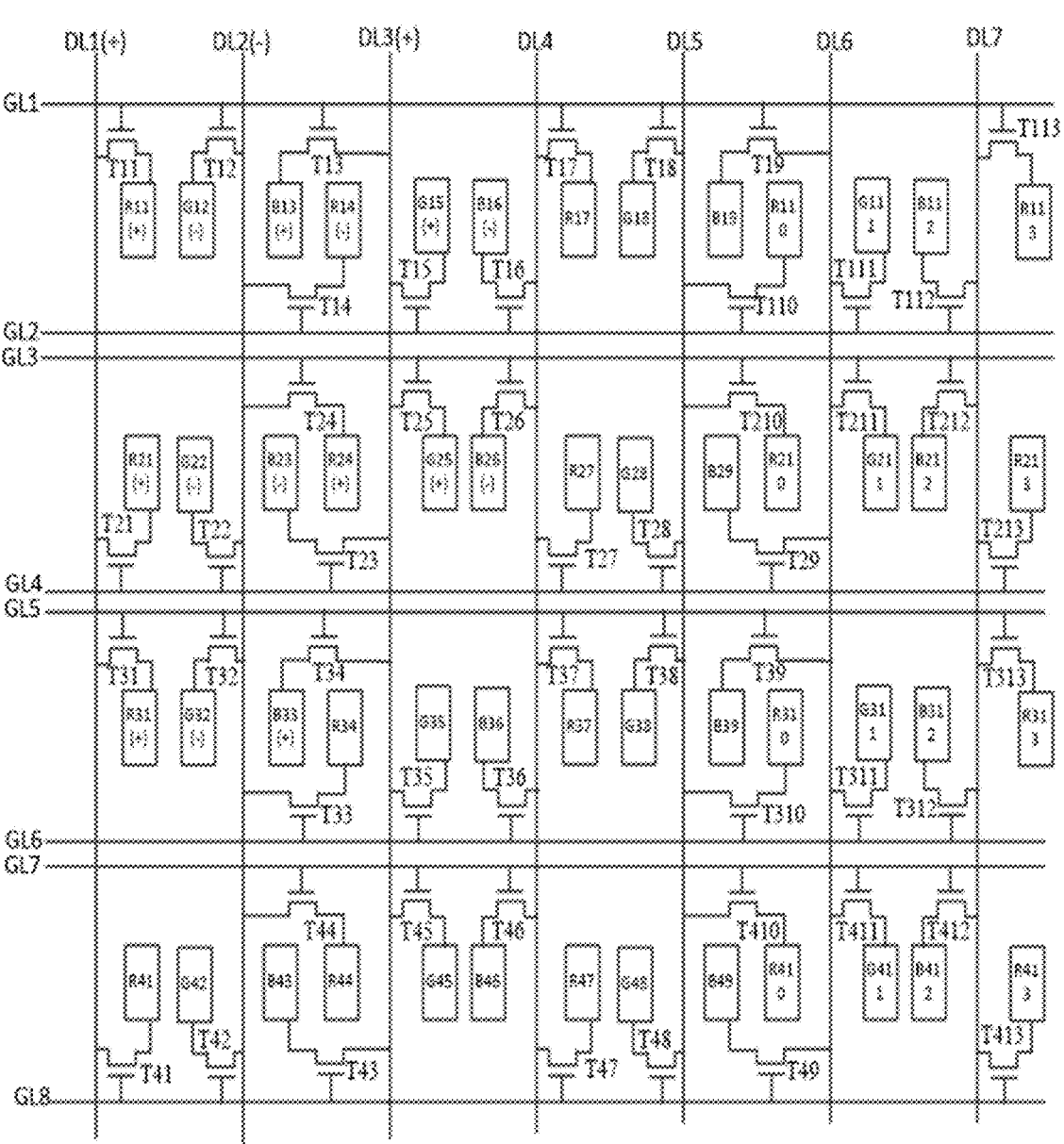
FIG. 5A is a schematic view showing a first operating state of the pixel structure in FIG. 4.

In at least one embodiment of the present disclosure, during the operation of the pixel structure in FIG. 4, in a case that the ¼ white-block image is to be displayed, i.e., in a case that six subpixels at an upper left corner display an image, as shown in FIG. 5A, at first, the first gate line GL1 is scanned, DL1 provides a positive data voltage, DL2 provides a negative data voltage, DL3 provides a positive data voltage, and DL4 provides an L0 grayscale data voltage, so T11, T12 and T13 are turned on, R11 receives a positive data voltage, G12 receives a negative data voltage, B13 receives a positive data voltage, and DL5, DL6 and DL7 provide an L0 grayscale data voltage.

Next, GL2 and GL3 are scanned simultaneously, so T14, T15, T16, T24, T25 and T26 are turned on simultaneously. DL1 provides a positive data voltage, DL2 provides a negative data voltage, DL3 provides a positive data voltage, DL4 provides a negative data voltage, R14 receives a negative data voltage, G15 receives a positive data voltage, B16 receives a negative data voltage, R24 receives a negative data voltage, G25 receives a positive data voltage, B26 receives a negative data voltage, and DL5, DL6 and DL7 provide an L0 grayscale data voltage.

Next, GL4 and GL5 are scanned simultaneously, so T21, T22, T23, T31, T32 and T33 are turned on simultaneously. DL1 provides a positive data voltage, DL2 provides a negative data voltage, DL3 provides a positive data voltage, DL4 provides an L0 grayscale data voltage, R21 receives a positive data voltage, G23 receives a negative data voltage, B23 provides a positive data voltage, R31 receives a positive data voltage, G32 receives a negative data voltage, B33 receives a positive data voltage, and DL5, DL6 and DL7 provide an L0 grayscale data voltage.

Then, GL6 and GL7 are scanned simultaneously, and DL1 to DL7 provide an L0 grayscale data voltage.

Apart from the above-mentioned subpixels receiving the data voltage, the other subpixels are all in a non-display state or an L0 grayscale data voltage is applied to these subpixels.

As shown in FIG. 5A, at an edge of the ¼ white image, the red subpixel in the third row and the first column, the green subpixel in the third row and the second column and the blue subpixel in the third row and the third column emit light simultaneously, so the edge is grayish and the abnormality in the image quality is not easy to perceive. In other words, referring to FIG. 5A, in the subpixels in the third row, in a case that the DLG mode is enabled, the subpixels proximate to the above subpixels having three colors do not emit light, so the edge of the ¼ white image is grayish, and it is able to prevent the occurrence of a display abnormality in a case that the subpixels display a same color.

Figure 5B:
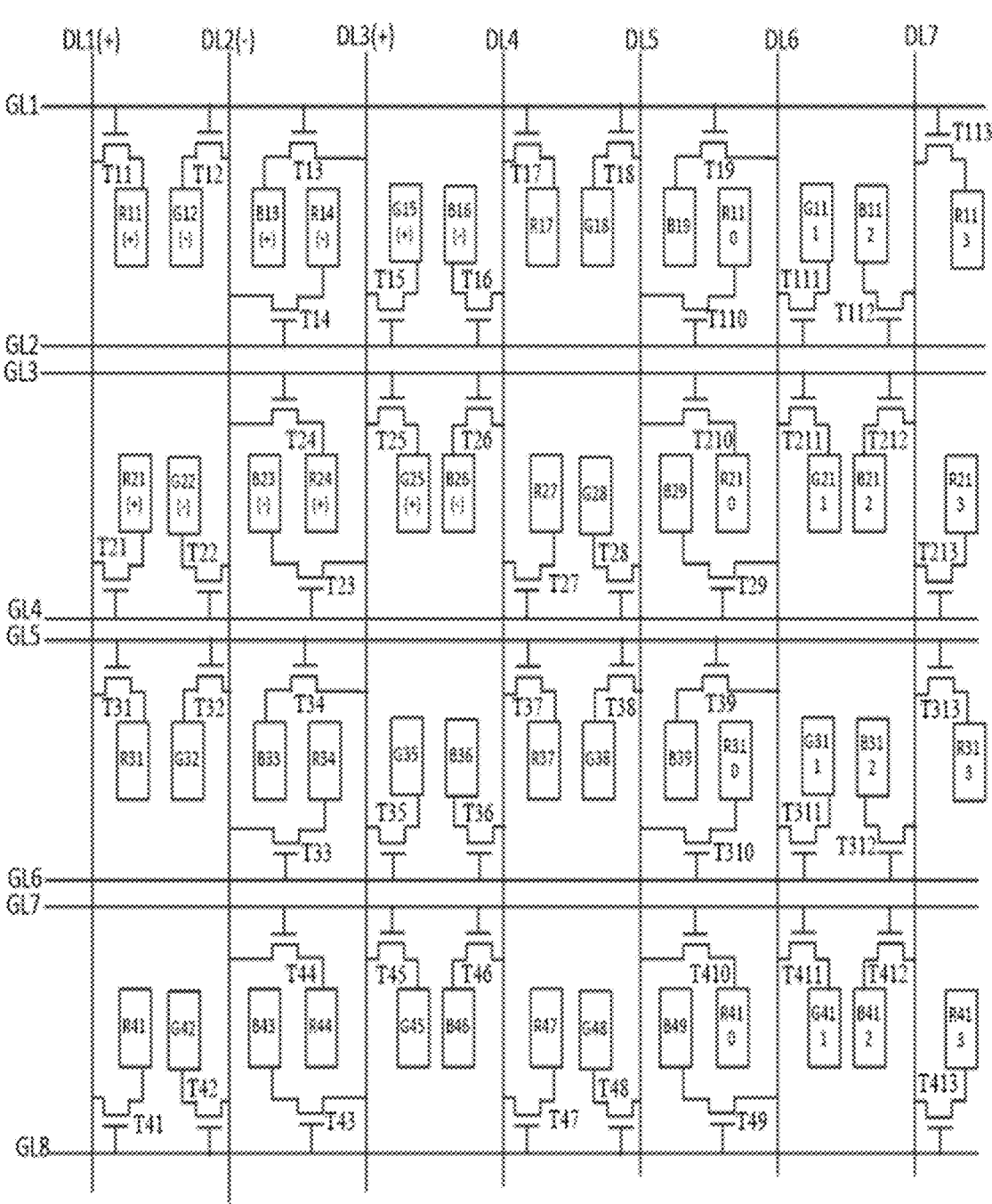
FIG. 5B is a schematic view showing a second operating state of the pixel structure in FIG. 4.

In at least one embodiment of the present disclosure, during the operation of the pixel structure in FIG. 4, in a case that a ¼ white-block image is to be displayed, i.e., the six subpixels at the upper left corner display an image, in the normal driving mode, as shown in FIG. 5B, at first GL1 is scanned, DL1 provides a positive data voltage, DL2 provides a negative data voltage, DL3 provides a positive data voltage, and DL4 provides an L0 grayscale data voltage, so T11, T12 and T13 are turned on, R11 receives a positive data voltage, G12 receives a negative data voltage, B13 receives a positive data voltage, and DL5, DL6 and DL7 provide an L0 grayscale data voltage.

Next, GL2 is scanned, DL1 provides a positive data voltage, DL2 provides a negative data voltage, DL3 provides a positive data voltage, and DL4 provides a negative data voltage, so T14, T15 and T16 are turned on, R14 receives a negative data voltage, G15 receives a positive data voltage, B16 receives a negative data voltage, and DL5, DL6 and DL7 provide an L0 grayscale data voltage.

Next, GL3 is scanned, DL1 provides a positive data voltage, DL2 provides a negative data voltage, DL3 provides a positive data voltage, and DL4 provides a negative data voltage, so T24, T25 and T26 are turned on, R24 receives a negative data voltage, G25 receives a positive data voltage, G26 receives a negative data voltage, and DL5, DL6 and DL7 provide an L0 grayscale data voltage.

Then, GL4 is scanned, DL1 provides a positive data voltage, DL2 provides a negative data voltage, DL3 provides a positive data voltage, and DL4 provides an L0 grayscale data voltage, so T21, T22 and T23 are turned on, R21 receives a positive data voltage, G22 receives a negative data voltage, B23 receives a positive data voltage, and DL5, DL6 and DL7 provide an L0 grayscale data voltage.

Based on the above, in the normal driving mode, the edge is normal in a case that the ¼ white-block image is displayed.

Figure 5C:
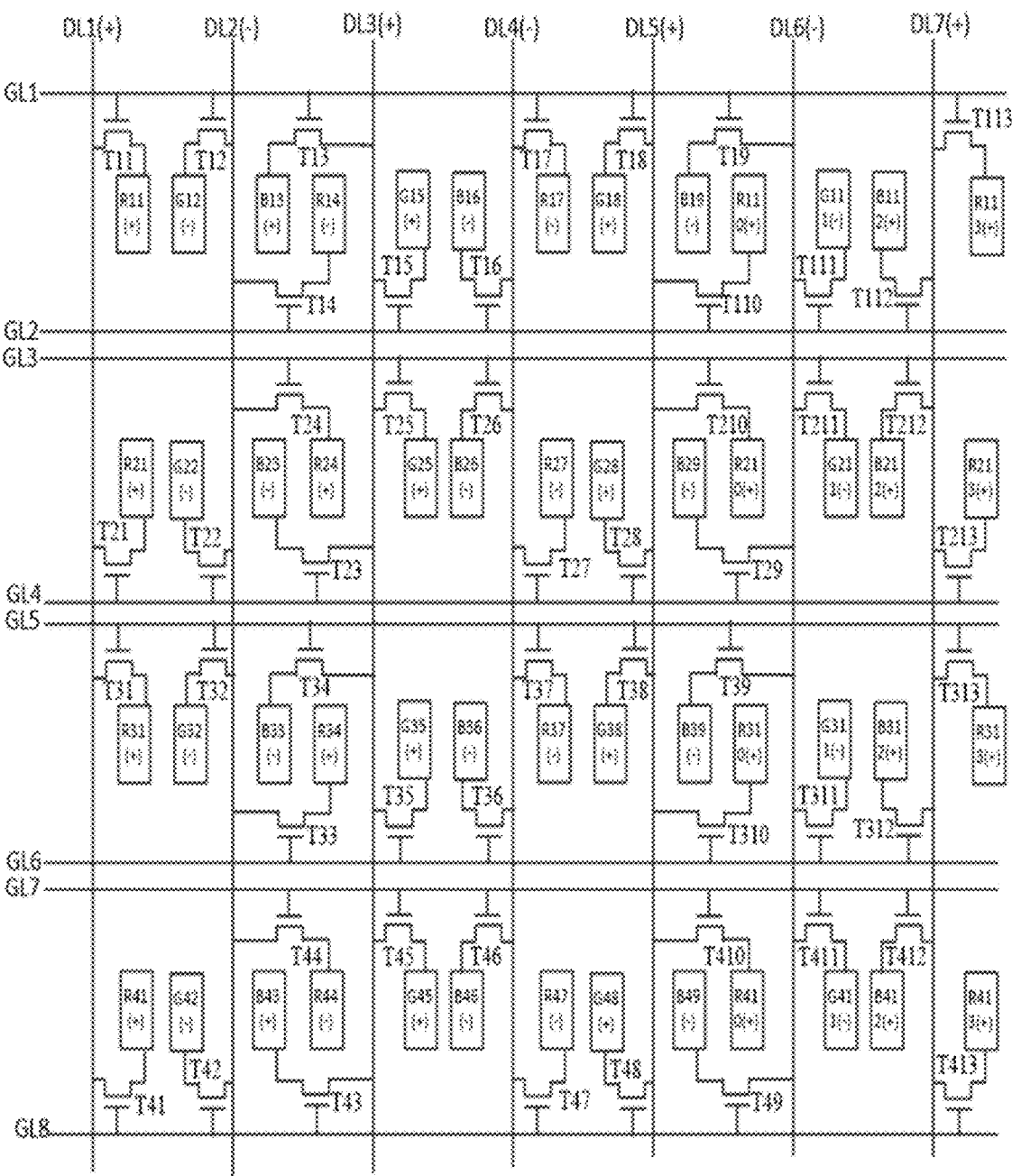
FIG. 5C is a schematic view showing a third operating state of the pixel structure in FIG. 4.

As shown in FIG. 5C, during the operation of the pixel structure in FIG. 4, DL1 provides a positive data voltage, DL2 provides a negative data voltage, DL3 provides a positive data voltage, DL4 provides a negative data voltage, DL5 provides a positive data voltage, DL6 provides a negative data voltage, and DL7 provides a positive data voltage. In the DLG mode, in a case that a full-screen image is to be displayed, at first GL1 is scanned, so T12, T133, T17, T18, T19 and T113 are turned on, R11 receives a positive data voltage, G12 receives a negative data voltage, B13 receives a positive data voltage, R17 receives a negative data voltage, G18 receives a positive data voltage, B19 receives a negative data voltage, and R113 receives a positive data voltage.

Next, GL2 and GL3 are scanned simultaneously, so T14, T15, T16, T110, T111 and T112 are turned on, R14 receives a negative data voltage, G15 receives a positive data voltage, B16 receives a negative data voltage, R110 receives a positive data voltage, G111 receives a negative data voltage, and B112 receives a positive data voltage. T24, T25, T26, T210, T211 and T212 are turned on, R24 receives a negative data voltage, G25 receives a positive data voltage, B26 receives a negative data voltage, R210 receives a positive data voltage, G211 receives a negative data voltage, and B212 receives a positive data voltage.

Next, GL4 and GL5 are scanned simultaneously, so T21, T22, T23, T27, T28 and T29 are turned on, R21 receives a positive data voltage, G22 receives a negative data voltage, B23 receives a positive data voltage, R27 receives a negative data voltage, G28 receives a positive data voltage, and B29 receives a negative data voltage. T31, T32, T33, T37, T38 and T39 are turned on, R31 receives a positive data voltage, G32 receives a negative data voltage, B33 receives a positive data voltage, R37 receives a negative data voltage, G38 receives a positive data voltage, and B39 receives a negative data voltage.

Next, GL6 and GL7 are scanned simultaneously, so T34, T35, T36, T310, T311 and T312 are turned on, R34 receives a negative data voltage, G35 receives a positive data voltage, B36 receives a negative data voltage, R310 receives a positive data voltage, G311 receives a negative data voltage, and B312 receives a positive data voltage. T44, T45, T46, T410, T411 and T412 are turned on, R44 receives a negative data voltage, G45 receives a positive data voltage, B46 receives a negative data voltage, R410 receives a positive data voltage, G411 receives a positive data voltage, and B412 receives a positive data voltage.

Then, GL8 is scanned, so T41, T42, T43, T47, T48 and T49 are turned on, R41 receives a positive data voltage, G42 receives a negative data voltage, B43 receives a positive data voltage, R47 receives a negative data voltage, G48 receives a positive data voltage, and B49 receives a negative data voltage.

As shown in FIG. 5C, in the DLG mode, in a case that a full-screen image is displayed, in 12 columns of subpixels, merely the sixth column of subpixels and the seventh column of subpixels have a same polarity in the adjacent columns. The subpixels in the sixth column are blue subpixels, and the subpixels in the seventh column are red subpixels. Human eyes are less sensitive to red and blue than green, so it is able to prevent the occurrence of the head-shaking patterns through the pixel structure in FIG. 4.

In at least one embodiment of the present disclosure, in the pixel structure, 12 columns of subpixels form a repeating cycle.

In at least one embodiment of the present disclosure, the subpixels in a same column in the pixel module have a same color, and the subpixels in two columns arranged between two data lines have different colors. The pixel structure includes N gate lines and a plurality of data lines, where N is an integer greater than 1. An $(8n-6)^{th}$ gate line and an $(8n-5)^{th}$ gate line are arranged between a $(4n-3)^{th}$ row of subpixels and a $(4n-2)^{th}$ row of subpixels, where n is a positive integer. In the subpixels in the $(4n-3)^{th}$ row and the subpixels in the $(4n-2)^{th}$ row, the subpixels that are in a same column and electrically coupled to the $(8n-6)^{th}$ gate line and the $(8n-5)^{th}$ gate line and have a same color are electrically coupled to a same data line. An $(8n-2)^{th}$ gate line and an $(8n-1)^{th}$ gate line are arranged between a $(4n-1)^{th}$ row of subpixels and a $(4n)^{th}$ row of subpixels. In the subpixels in the $(4n-1)^{th}$ row and the subpixels in the $(4n)^{th}$ row, the subpixels that are in a same column and electrically coupled to the $(8n-2)^{th}$ gate line and the $(8n-1)^{th}$ gate line and have a same color are electrically coupled to a same data line.

During the implementation, two gate lines are arranged between two adjacent rows of subpixels, the $(8n-6)^{th}$ gate line and the $(8n-5)^{th}$ gate line are arranged between the $(4n-3)^{th}$ row of subpixels and the $(4n-2)^{th}$ row of subpixels, where n is a positive integer. In the subpixels in the $(4n-3)^{th}$ row and the subpixels in the $(4n-2)^{th}$ row, the subpixels that are in a same column and electrically coupled to the $(8n-6)^{th}$ gate line and the $(8n-5)^{th}$ gate line and have a same color are electrically coupled to a same data line. The $(8n-2)^{th}$ gate line and the $(8n-1)^{th}$ gate line are arranged between the $(4n-1)^{th}$ row of subpixels and the $(4n)^{th}$ row of subpixels. In the subpixels in the $(4n-1)^{th}$ row and the subpixels in the $(4n)^{th}$ row, the subpixels that are in a same column and electrically coupled to the $(8n-2)^{th}$ gate line and the $(8n-1)^{th}$ gate line and have a same color are electrically coupled to a same data line.

In a possible embodiment of the present disclosure, in the subpixels in the $(4n-3)^{th}$ row, two subpixels having different colors are arranged between a $d^{th}$ data line and a $(d+1)^{th}$ data line, one of the two subpixels having different colors is electrically coupled to an $(8n-7)^{th}$ gate line and the $(d+1)^{th}$ data line, and the other of the two subpixels having different colors is electrically coupled to an $(8n-6)^{th}$ gate line and the $(d+1)^{th}$ data line, where d is a positive integer.

In at least one embodiment of the present disclosure, an $(8n-4)^{th}$ gate line and an $(8n-3)^{th}$ gate line are arranged between the $(4n-2)^{th}$ row of subpixels and the $(4n-1)^{th}$ row of subpixels. In the subpixels in the $(4n-2)^{th}$ row, two subpixels having different colors are arranged between a $d^{th}$ data line and a $(d+1)^{th}$ data line, one of the two subpixels having different colors is electrically coupled to the $(8n-4)^{th}$ gate line and the $(d+1)^{th}$ data line, and the other of the two subpixels having different colors is electrically coupled to the $(8n-3)^{th}$ gate line and the $(d+1)^{th}$ data line, where d is a positive integer.

In at least one embodiment of the present disclosure, an $(8n-4)^{th}$ gate line and an $(8n-3)^{th}$ gate line are arranged between the $(4n-2)^{th}$ row of subpixels and the $(4n-1)^{th}$ row of subpixels. In the subpixels in the $(4n-1)^{th}$ row, two subpixels having different colors are arranged between a $d^{th}$ data line and a $(d+1)^{th}$ data line, one of the two subpixels having different colors is electrically coupled to the $d^{th}$ data line and the $(8n-2)^{th}$ gate line, and the other of the two subpixels having different colors is electrically coupled to the $d^{th}$ data line and the $(8n-3)^{th}$ gate line, where d is a positive integer.

In at least one embodiment of the present disclosure, in the subpixels in the $(4n)^{th}$ row, two subpixels having different colors are arranged between a $d^{th}$ data line and a $(d+1)^{th}$ data line, one of the two subpixels having different colors is electrically coupled to an $(8n-1)^{th}$ gate line and the $d^{th}$ data line, and the other of the two subpixels having different colors is electrically coupled to an $(8n)^{th}$ gate line and the $d^{th}$ data line, where d is a positive integer.

Figure 6:
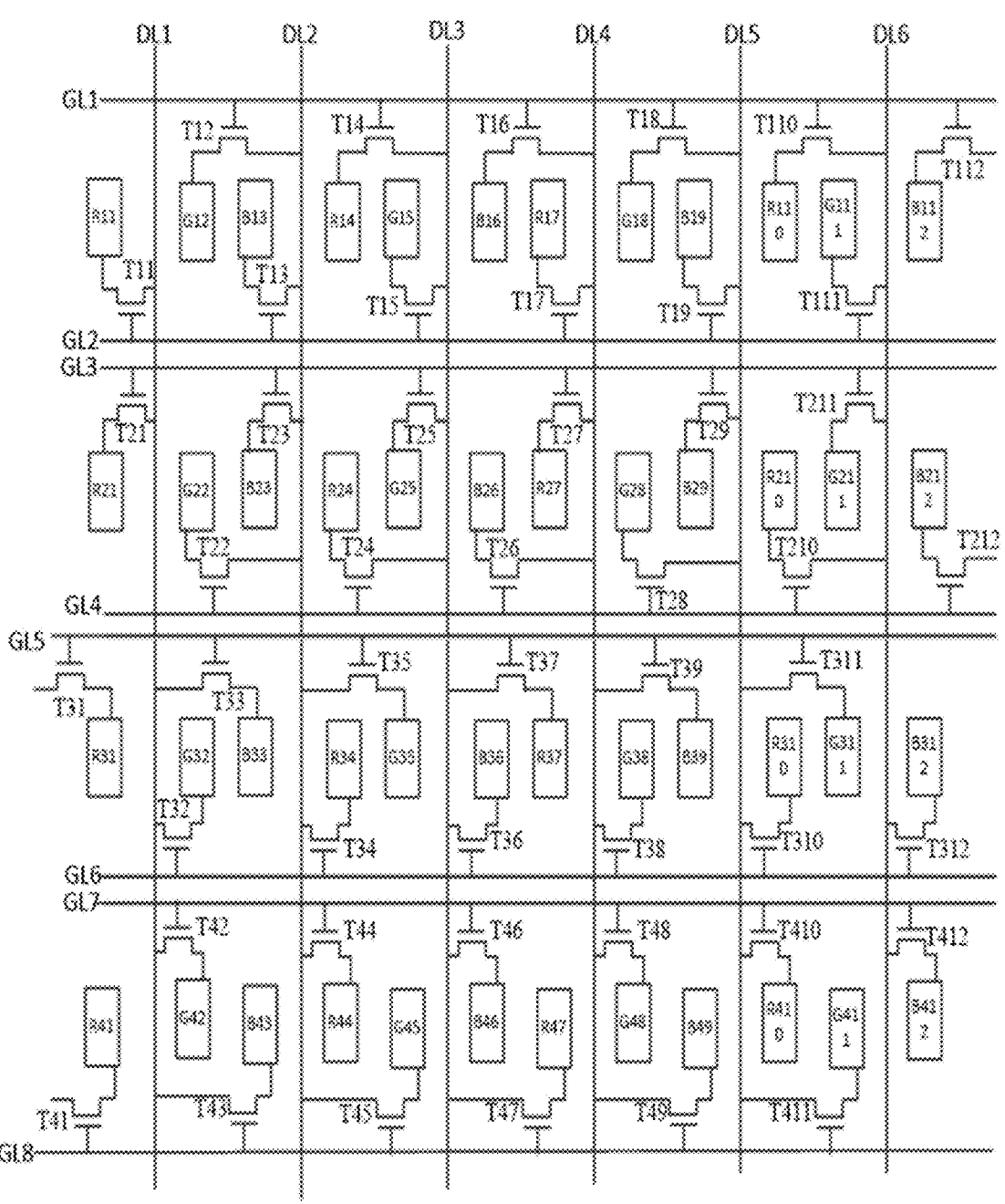
FIG. 6 is a structural view of the pixel structure according to at least one embodiment of the present disclosure.

As shown in FIG. 6, the red subpixel in the first row and the first column includes a red pixel electrode R11 in the first row and the first column and a switching transistor T11 in the first row and the first column. A gate electrode of T11 is electrically coupled to GL2, a source electrode T11 is electrically coupled to DL1, and a drain electrode of T11 is electrically coupled to R11.

The green subpixel in the first row and the second column includes a green pixel electrode G12 in the first row and the second column and a switching transistor T12 in the first row and the second column. A gate electrode of T12 is electrically coupled to GL1, a source electrode of T12 is electrically coupled to DL2, and a drain electrode of T12 is electrically coupled to G12.

The blue subpixel in the first row and the third column includes a blue pixel electrode B13 in the first row and the third column and a switching transistor T13 in the first row and the third column. A gate electrode of T13 is electrically coupled to GL2, a source electrode of T13 is electrically coupled to DL2, and a drain electrode of T13 is electrically coupled to B13.

The red subpixel in the first row and the fourth column includes a red pixel electrode R14 in the first row and the fourth column and a switching transistor T14 in the first row and the fourth column. A gate electrode of T14 is electrically coupled to GL1, a source electrode T14 is electrically coupled to DL3, and a drain electrode of T14 is electrically coupled to R14.

The green subpixel in the first row and the fifth column includes a green pixel electrode G15 in the first row and the fifth column and a switching transistor T15 in the first row and the fifth column. A gate electrode of T15 is electrically coupled to GL2, a source electrode of T15 is electrically coupled to DL3, and a drain electrode of T15 is electrically coupled to G15. The description about the subpixels in the first row and the other columns may refer to those mentioned hereinabove, and thus will not be particularly defined herein.

The green subpixel in the first row and the eleventh column includes a green pixel electrode G111 in the first row and the eleventh column and a switching transistor T111 in the first row and the eleventh column. A gate electrode of T111 is electrically coupled to GL2, a source electrode of T111 is electrically coupled to DL6, and a drain electrode of T111 is electrically coupled to G111.

The blue subpixel in the first row and the twelfth column includes a blue pixel electrode B112 in the first row and the twelfth column and a switching transistor T112 in the first row and the twelfth column. A gate electrode of T112 is electrically coupled to GL1, a source electrode of T112 is electrically coupled to DL7, and a drain electrode of T112 is electrically coupled to B112.

The red subpixel in the second row and the first column includes a red pixel electrode R21 in the second row and the first column and a switching transistor T21 in the second row and the first column. A gate electrode of T21 is electrically coupled to GL3, a source electrode T21 is electrically coupled to DL1, and a drain electrode of T21 is electrically coupled to R21.

The green subpixel in the second row and the second column includes a green pixel electrode G22 in the second row and the second column and a switching transistor T22 in the second row and the second column. A gate electrode of T22 is electrically coupled to GL4, a source electrode T22 is electrically coupled to DL2, and a drain electrode of T22 is electrically coupled to G22.

The blue subpixel in the second row and the third column includes a blue pixel electrode B23 in the second row and the third column and a switching transistor T23 in the second row and the third column. A gate electrode of T23 is electrically coupled to GL3, a source electrode T23 is electrically coupled to DL2, and a drain electrode of T23 is electrically coupled to B23.

The red subpixel in the second row and the fourth column includes a red pixel electrode R24 in the second row and the fourth column and a switching transistor T24 in the second row and the fourth column. A gate electrode of T24 is electrically coupled to GL4, a source electrode T24 is electrically coupled to DL3, and a drain electrode of T24 is electrically coupled to R24.

The green subpixel in the second row and the fifth column includes a green pixel electrode G25 in the second row and the fifth column and a switching transistor T25 in the second row and the fifth column. A gate electrode of T25 is electrically coupled to GL3, a source electrode T25 is electrically coupled to DL3, and a drain electrode of T25 is electrically coupled to G25.

The blue subpixel in the second row and the sixth column includes a blue pixel electrode B26 in the second row and the sixth column and a switching transistor T26 in the second row and the sixth column. A gate electrode of T26 is electrically coupled to GL4, a source electrode T26 is electrically coupled to DL4, and a drain electrode of T26 is electrically coupled to B26. The description about the subpixels in the second row may refer to those mentioned hereinabove, and thus will not be particularly defined herein.

The red subpixel in the third row and the first column includes a red pixel electrode R31 in the third row and the first column and a switching transistor T31 in the third row and the first column. A gate electrode of T31 is electrically coupled to GL5, and a drain electrode of T31 is electrically coupled to R31.

The green subpixel in the third row and the second column includes a green pixel electrode G32 in the third row and the second column and a switching transistor T32 in the third row and the second column. A gate electrode of T32 is electrically coupled to GL6, a source electrode T32 is electrically coupled to DL1, and a drain electrode of T32 is electrically coupled to G32.

The blue subpixel in the third row and the third column includes a blue pixel electrode B33 in the third row and the third column and a switching transistor T33 in the third row and the third column. A gate electrode of T33 is electrically coupled to GL5, a source electrode T33 is electrically coupled to DL1, and a drain electrode of T33 is electrically coupled to B33.

The red subpixel in the third row and the fourth column includes a red pixel electrode R34 in the third row and the fourth column and a switching transistor T34 in the third row and the fourth column. A gate electrode of T34 is electrically coupled to GL6, a source electrode of T34 is electrically coupled to DL2, and a drain electrode of T34 is electrically coupled to R34.

The green subpixel in the third row and the fifth column includes a green pixel electrode G35 in the third row and the fifth column and a switching transistor T35 in the third row and the fifth column. A gate electrode of T35 is electrically coupled to GL5, a source electrode T35 is electrically coupled to DL2, and a drain electrode of T35 is electrically coupled to G35.

The blue subpixel in the third row and the sixth column includes a blue pixel electrode B36 in the third row and the sixth column and a switching transistor T36 in the third row and the sixth column. A gate electrode of T36 is electrically coupled to GL6, a source electrode T36 is electrically coupled to DL3, and a drain electrode of T36 is electrically coupled to B36. The description about the other subpixels in the third row may refer to those mentioned hereinabove, and thus will not be particularly defined herein.

The red subpixel in the fourth row and the first column includes a red pixel electrode R41 in the fourth row and the first column and a switching transistor T41 in the fourth row and the first column. A gate electrode of T41 is electrically coupled to GL8, and a drain electrode of T41 is electrically coupled to R41.

The green subpixel in the fourth row and the second column includes a green pixel electrode G42 in the fourth row and the second column and a switching transistor T42 in the fourth row and the second column. A gate electrode of T42 is electrically coupled to GL7, a source electrode T42 is electrically coupled to DL1, and a drain electrode of T42 is electrically coupled to G42.

The blue subpixel in the fourth row and the third column includes a blue pixel electrode B43 in the fourth row and the third column and a switching transistor T43 in the fourth row and the third column. A gate electrode of T43 is electrically coupled to GL8, a source electrode T43 is electrically coupled to DL1, and a drain electrode of T43 is electrically coupled to B43.

The red subpixel in the fourth row and the fourth column includes a red pixel electrode R44 in the fourth row and the fourth column and a switching transistor T44 in the fourth row and the fourth column. A gate electrode of T44 is electrically coupled to GL7, a source electrode of T44 is electrically coupled to DL2, and a drain electrode of T44 is electrically coupled to R44.

The green subpixel in the fourth row and the fifth column includes a green pixel electrode G45 in the fourth row and the fifth column and a switching transistor T45 in the fourth row and the fifth column. A gate electrode of T45 is electrically coupled to GL8, a source electrode T45 is electrically coupled to DL2, and a drain electrode of T45 is electrically coupled to G45.

The blue subpixel in the fourth row and the sixth column includes a blue pixel electrode B46 in the fourth row and the sixth column and a switching transistor T46 in the fourth row and the sixth column. A gate electrode of T46 is electrically coupled to GL7, a source electrode T46 is electrically coupled to DL3, and a drain electrode of T46 is electrically coupled to B46. The description about the subpixels in the other columns may refer to those mentioned hereinabove, and thus will not be particularly defined herein.

In the pixel structure in FIG. 6, in two adjacent rows of subpixels, the switching transistors electrically coupled to two gate lines between the two rows of subpixels form a back-to-back structure.

Figure 7A:
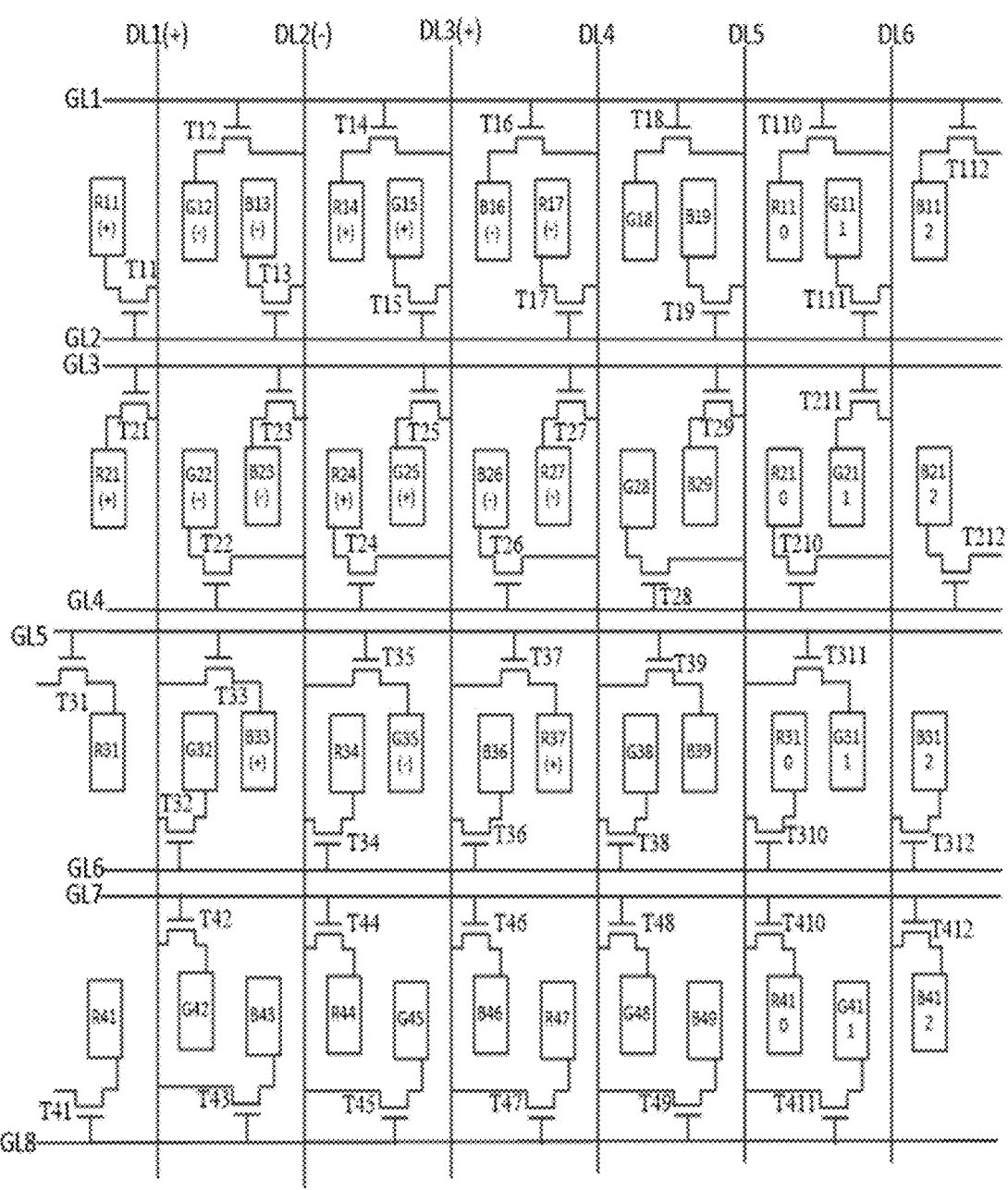
FIG. 7A is a schematic view showing a first operating state of the pixel structure in FIG. 5.

In at least one embodiment of the present disclosure, during the operation of the pixel structure in FIG. 6, in a case that a ¼ white-block image is to be displayed, i.e., six subpixels at an upper left corner display an image, as shown in FIG. 7A, at first the first gate line GL1 is scanned, DL1 provides a positive data voltage, DL2 provides a negative data voltage, DL3 provides a positive data voltage, and DL4 provides a negative data voltage, so T12, T14 and T16 are turned on, G12 receives a negative data voltage, G14 receives a positive data voltage, B16 receives a negative data voltage, and DL5 and DL6 provide an L0 grayscale data voltage.

Next, GL2 and GL3 are scanned simultaneously, so T11, T13, T15, T21, T23 and T25 are turned on simultaneously. DL1 provides a positive data voltage, DL2 provides a negative data voltage, DL3 provides a positive data voltage, and DL4 provides an L0 grayscale data voltage, so R14 receives a negative data voltage, R11 receives a positive data voltage, B13 receives a negative data voltage, G16 receives a positive data voltage, R21 receives a positive data voltage, B23 receives a negative data voltage, G25 receives a positive data voltage, and DL5 and DL6 provide an L0 grayscale data voltage.

Then, GL4 and GL5 are scanned simultaneously, so T22, T24, T26, T33, T35 and T37 are turned on simultaneously. DL1 provides a positive data voltage, DL2 provides a negative data voltage, DL3 provides a positive data voltage, and DL4 provides a negative data voltage, so G22 receives a negative data voltage, R24 receives a positive data voltage, B26 receives a negative data voltage, B33 receives a positive data voltage, G35 receives a negative data voltage, B37 receives a positive data voltage, and DL5 and DL6 provide an L0 grayscale data voltage.

Apart from the above subpixels receiving the data voltage, the other subpixels are in a non-display state or receive an L0 grayscale data voltage.

As shown in FIG. 7A, at the edge of the ¼ white image, the blue subpixel in the third row and the third column, the green subpixel in the third row and the fifth column, the red subpixel in the third row and the seventh column and the blue subpixel in the third row and the ninth column emit light simultaneously, so the edge is grayish, and the abnormality in the image quality is not easy to perceive.

Figure 7B:
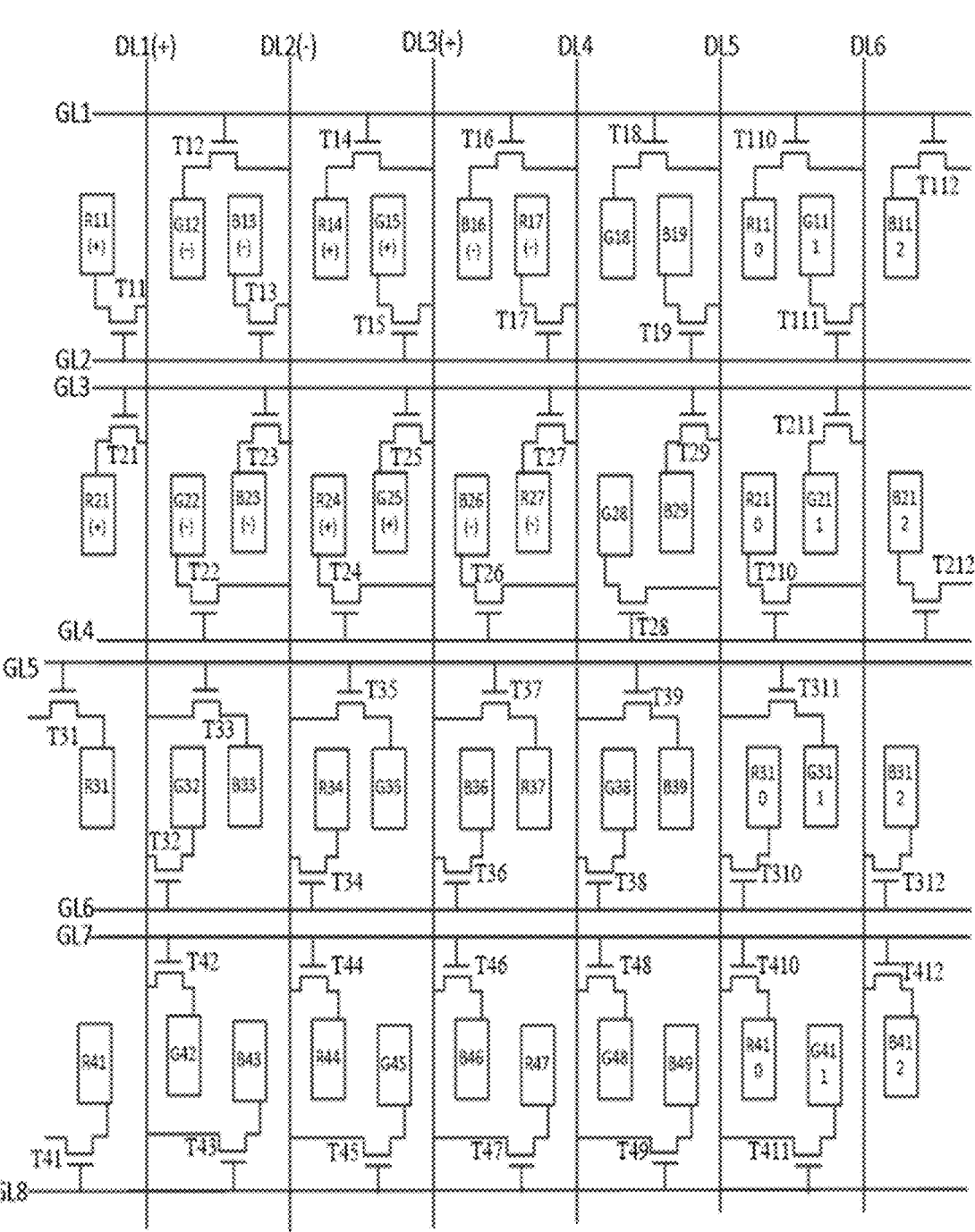
FIG. 7B is a schematic view showing a second operating state of the pixel structure in FIG. 5.

In at least one embodiment of the present disclosure, during the operation of the pixel structure in FIG. 6, in a case that the ¼ white-block image is to be displayed, i.e., the six subpixels at an upper left corner display an image, in the normal driving mode, as shown in FIG. 7B, at first, GL1 is scanned, DL1 provides a positive data voltage, DL2 provides a negative data voltage, DL3 provides a positive data voltage and DL4 provides a negative data voltage, so T12, T14 and T16 are turned on, G12 receives a negative data voltage, R14 receives a positive data voltage, B16 receives a negative data voltage, and DL5 and DL6 provide an L0 grayscale data voltage.

Next, GL2 is scanned, DL1 provides a positive data voltage, DL2 provides a negative data voltage, DL3 provides a positive data voltage, and DL4 provides an L0 grayscale data voltage, so T11, T13 and T15 are turned on, R11 receives a positive data voltage, B13 receives a negative data voltage, G15 receives a positive data voltage, and DL5 and DL6 provide an L0 grayscale data voltage.

Next, GL3 is scanned, DL1 provides a positive data voltage, DL2 provides a negative data voltage, DL3 provides a positive data voltage, and DL4 provides an L0 grayscale data voltage, so T21, T23 and T25 are turned on, R21 receives a positive data voltage, B23 receives a negative data voltage, G25 receives a positive data voltage, and DL5 and DL6 provide an L0 grayscale data voltage.

Next, GL4 is scanned, DL1 provides a positive data voltage, DL2 provides a negative data voltage, DL3 provides a positive data voltage, and DL4 provides a negative data voltage, so T22, T24 and T26 are turned on, G22 receives a negative data voltage, R24 receives a positive data voltage, B26 receives a negative data voltage, and DL5 and DL6 provide an L0 grayscale data voltage.

Then, GL5 is scanned, and DL1 to DL6 provide an L0 grayscale data voltage.

Based on the above, in the normal driving mode, the edge is normal in a case that the ¼ white-block image is displayed.

Figure 7C:
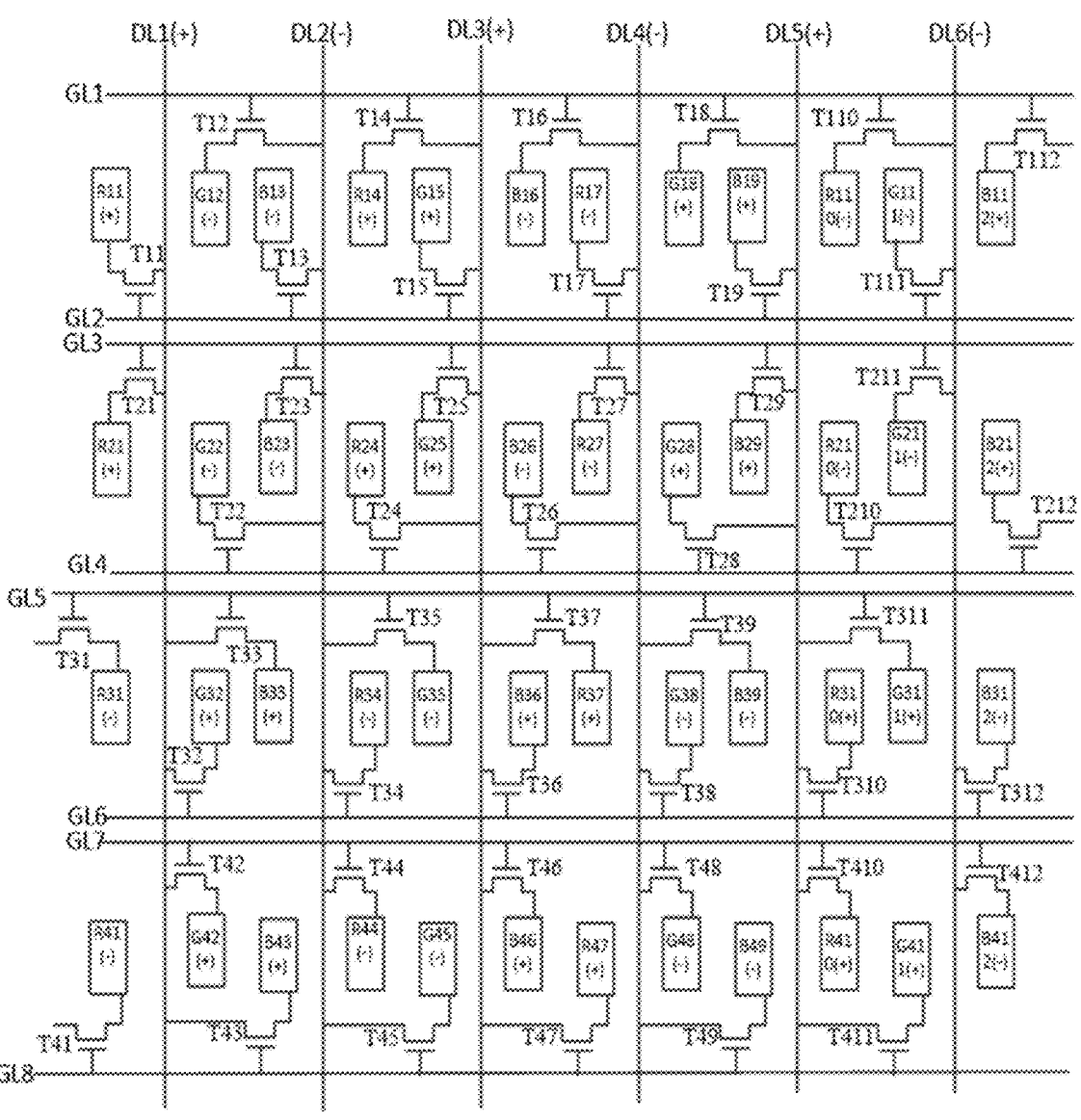
FIG. 7C is a schematic view showing a third operating state of the pixel structure in FIG. 5.

As shown in FIG. 7C, during the operation of the pixel structure in FIG. 6, DL1 provides a positive data voltage, DL2 provides a negative data voltage, DL3 provides a positive data voltage, DL4 provides a negative data voltage, DL5 provides a positive data voltage, DL6 provides a negative data voltage, and DL7 provides a positive data voltage. In the DLG mode, in a case that a full-screen image is to be displayed, at first GL1 is scanned, so T12, T14, T16, T18, T110 and T112 are turned on, G12 receives a negative data voltage, R14 receives a positive data voltage, B16 receives a negative data voltage, G18 receives a positive data voltage, R110 receives a negative data voltage, and B112 receives a positive data voltage.

Next, GL2 and GL3 are scanned, so T11, T13, T15, T17, T19 and T111 are turned on, R11 receives a positive data voltage, B13 receives a negative data voltage, G15 receives a positive data voltage, R17 receives a negative data voltage, B19 receives a positive data voltage, and G111 receives a negative data voltage. T21, T23, T25, T27, T29 and T211 are turned on, R21 receives a positive data voltage, B23 receives a negative data voltage, G25 receives a positive data voltage, R27 receives a negative data voltage, B29 receives a positive data voltage, and G211 receives a negative data voltage.

Next, GL4 and GL5 are scanned, so T22, T24, T26, T28, T210 and T212 are turned on, G22 receives a negative data voltage, R24 receives a positive data voltage, B26 receives a negative data voltage, G28 receives a positive data voltage, R210 receives a negative data voltage, and B212 receives a positive data voltage. T31, T33, T35, T37, T39 and T311 are turned on, R31 receives a negative data voltage, R33 receives a positive data voltage, G35 receives a negative data voltage, R37 receives a positive data voltage, B39 receives a negative data voltage, and G311 receives a positive data voltage.

Next, GL6 and GL7 are scanned, so T32, T34, T36, T38, T310 and T312 are turned on, G32 receives a positive data voltage, R34 receives a negative data voltage, B36 receives a positive data voltage, G38 receives a negative data voltage, R310 receives a positive data voltage, and B312 receives a positive data voltage. T42, T44, T46, T48, T410 and T412 are turned on, G42 receives a positive data voltage, R44 receives a negative data voltage, B46 receives a positive data voltage, G48 receives a negative data voltage, R410 receives a positive data voltage, and B412 receives a negative data voltage.

Then, GL8 is scanned, so T41, T43, T45, T47, T49 and T411 are turned on, R41 receives a negative data voltage, B43 receives a positive data voltage, G45 receives a negative data voltage, R47 receives a positive data voltage, B49 receives a negative data voltage, and G411 receives a positive data voltage.

As shown in FIG. 7C, in the DLG mode of the pixel structure in FIG. 6, in a case that a full-screen image is displayed, polarities of the pixels are distributed in a mode similar to dot-inversion (every four subpixels have a same polarity), so as to remarkably prevent the occurrence of the head-shaking patterns.

In at least one embodiment of the present disclosure, the subpixels in the $(3a-2)^{th}$ column have a first color, the subpixels in the $(3a-1)^{th}$ column have a second color, and the subpixels in the $(3a)^{th}$ column have a third color, where a is a positive integer; or the subpixels in the $(3a-2)^{th}$ column have a third color, the subpixels in the $(3a-1)^{th}$ column have a second color, and the subpixels in the $(3a)^{th}$ column have a first color; or the subpixels in the $(3a-2)^{th}$ column have a first color, the subpixels in the $(3a-1)^{th}$ column have a third color, and the subpixels in the $(3a)^{th}$ column have a second color.

The first color is red, the second color is green, and the third color is blue. However, the present disclosure is not limited thereto.

Figure 8:
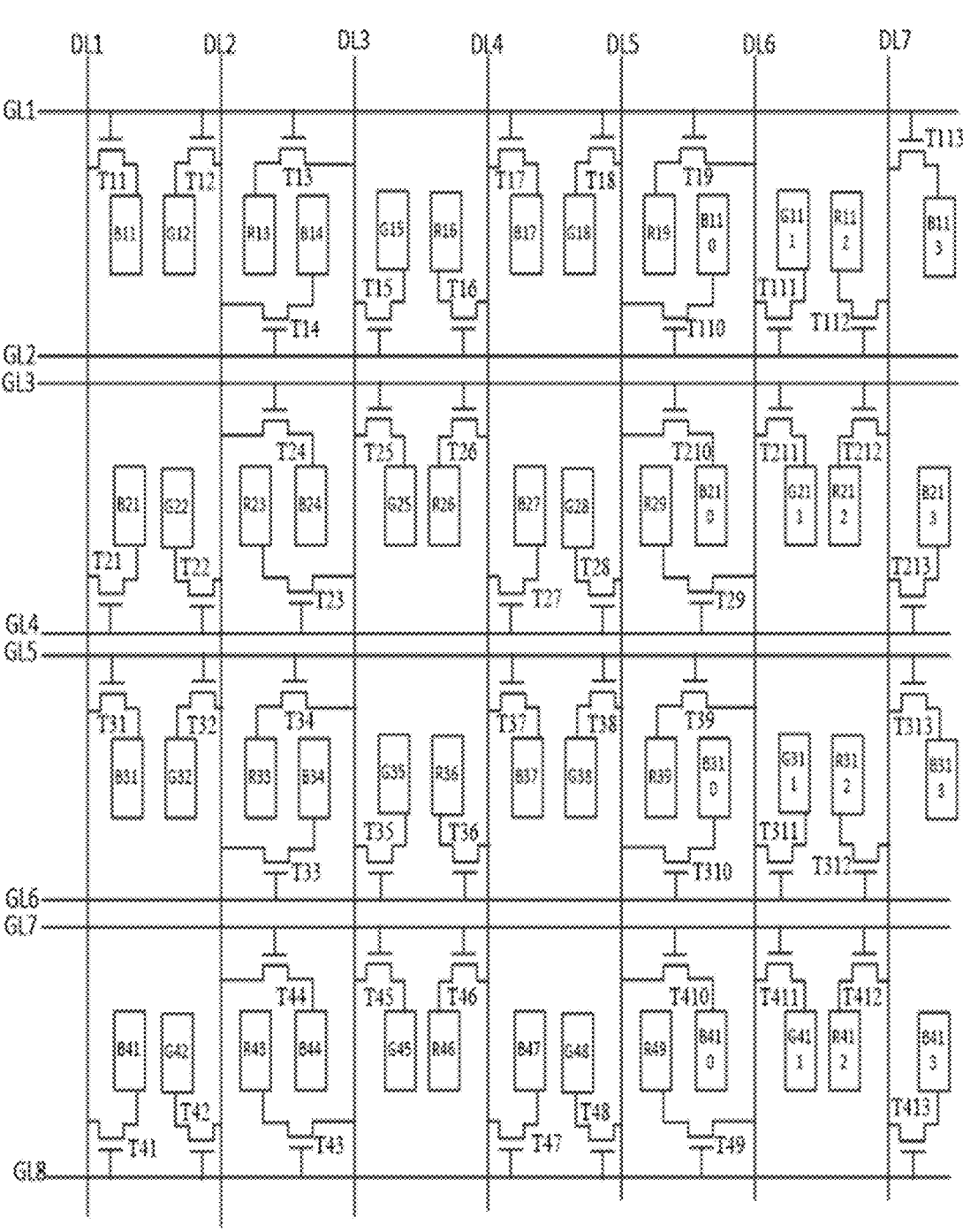
FIG. 8 is a structural view of the pixel structure according to at least one embodiment of the present disclosure.

As shown in FIG. 8, the blue subpixel in the first row and the first column includes a blue pixel electrode B11 in the first row and the first column and a switching transistor T11 in the first row and the first column. A gate electrode of T11 is electrically coupled to GL1, a source electrode T11 is electrically coupled to DL1, and a drain electrode of T11 is electrically coupled to B11.

The green subpixel in the first row and the second column includes a green pixel electrode G12 in the first row and the second column and a switching transistor T12 in the first row and the second column. A gate electrode of T12 is electrically coupled to GL1, a source electrode of T12 is electrically coupled to DL2, and a drain electrode of T12 is electrically coupled to G12.

The red subpixel in the first row and the third column includes a red pixel electrode R13 in the first row and the third column and a switching transistor T13 in the first row and the third column. A gate electrode of T13 is electrically coupled to GL1, a source electrode of T13 is electrically coupled to DL3, and a drain electrode of T13 is electrically coupled to R13.

The blue subpixel in the first row and the fourth column includes a blue pixel electrode B14 in the first row and the fourth column and a switching transistor T14 in the first row and the fourth column. A gate electrode of T14 is electrically coupled to GL2, a source electrode T14 is electrically coupled to DL2, and a drain electrode of T14 is electrically coupled to B14.

The green subpixel in the first row and the fifth column includes a green pixel electrode G15 in the first row and the fifth column and a switching transistor T15 in the first row and the fifth column. A gate electrode of T15 is electrically coupled to GL2, a source electrode of T15 is electrically coupled to DL3, and a drain electrode of T15 is electrically coupled to G15.

The red subpixel in the first row and the sixth column includes a red pixel electrode R16 in the first row and the sixth column and a switching transistor T16 in the first row and the sixth column. A gate electrode of T16 is electrically coupled to GL2, a source electrode of T16 is electrically coupled to DL4, and a drain electrode of T16 is electrically coupled to R16. The connection relationship about the other subpixels in the first row may refer to FIG. 8, and thus will not be particularly defined herein.

In at least one embodiment of the present disclosure, B17 represents the blue pixel electrode in the first row and the seventh column, G18 represents the green pixel electrode in the first row and the eighth column, R19 represents the red pixel electrode in the first row and the ninth column, B110 represents the blue pixel electrode in the first row and the tenth column, G111 represents the green pixel electrode in the first row and the eleventh column, R112 represents the red pixel electrode in the first row and the twelfth column, and B113 represents the blue pixel electrode in the first row and the thirteenth column.

The blue subpixel in the second row and the first column includes a blue pixel electrode B21 in the second row and the first column and a switching transistor T21 in the second row and the first column. A gate electrode of T21 is electrically coupled to GL4, a source electrode of T21 is electrically coupled to DL1, and a drain electrode of T21 is electrically coupled to B21.

The green subpixel in the second row and the second column includes a green pixel electrode G22 in the second row and the second column and a switching transistor T22 in the second row and the second column. A gate electrode of T22 is electrically coupled to GL4, a source electrode of T22 is electrically coupled to DL2, and a drain electrode of T22 is electrically coupled to G22.

The red subpixel in the second row and the third column includes a red pixel electrode R23 in the second row and the third column and a switching transistor T23 in the second row and the third column. A gate electrode of T23 is electrically coupled to GL4, a source electrode of T23 is electrically coupled to DL3, and a drain electrode of T23 is electrically coupled to R23.

The blue subpixel in the second row and the fourth column includes a blue pixel electrode B24 in the second row and the fourth column and a switching transistor T24 in the second row and the fourth column. A gate electrode of T24 is electrically coupled to GL3, a source electrode of T24 is electrically coupled to DL2, and a drain electrode of T24 is electrically coupled to B24.

The green subpixel in the second row and the fifth column includes a green pixel electrode G25 in the second row and the fifth column and a switching transistor T25 in the second row and the fifth column. A gate electrode of T25 is electrically coupled to GL3, a source electrode of T25 is electrically coupled to DL3, and a drain electrode of T25 is electrically coupled to G25.

The red subpixel in the second row and the sixth column includes a red pixel electrode R26 in the second row and the sixth column and a switching transistor T26 in the second row and the sixth column. A gate electrode of T26 is electrically coupled to GL3, a source electrode of T26 is electrically coupled to DL4, and a drain electrode of T26 is electrically coupled to R26. The connection relationship about the other subpixels in the second row may refer to FIG. 8, and thus will not be particularly defined herein. In other, the connection relationship about the subpixels in the third row and the fourth row may refer to FIG. 8, and thus will not be particularly defined herein.

In at least one embodiment of the present disclosure, B27 represents the blue pixel electrode in the second row and the seventh column, G28 represents the green pixel electrode in the second row and the eighth column, R29 represents the red pixel electrode in the second row and the ninth column, B210 represents the blue pixel electrode in the second row and the ninth column, G211 represents the green pixel electrode in the second row and the eleventh column, R212 represents the red pixel electrode in the second row and the twelfth column, and B213 represents the blue pixel electrode in the second row and the thirteenth column.

B31 represents the blue pixel electrode in the third row and the first column, G32 represents the green pixel electrode in the third row and the second column, R33 represents the red pixel electrode in the third row and the third column, B34 represents the blue pixel electrode in the third row and the fourth column, G35 represents the green pixel electrode in the third row and the fifth column, R36 represents the red pixel electrode in the third row and the sixth column, B37 represents the blue pixel electrode in the third row and the seventh column, G38 represents the green pixel electrode in the third row and the eighth column, R39 represents the red pixel electrode in the third row and the ninth column, B310 represents the blue pixel electrode in the third row and the tenth column, G311 represents the green pixel electrode in the third row and the eleventh column, R312 represents the red pixel electrode in the third row and the twelfth column, and B313 represents the blue pixel electrode in the third row and the thirteenth column.

B41 represents the blue pixel electrode in the fourth row and the first column, G42 represents the green pixel electrode in the fourth row and the second column, R43 represents the red pixel electrode in the fourth row and the third column, B44 represents the blue pixel electrode in the fourth row and the fourth column, G45 represents the green pixel electrode in the fourth row and the fifth column, R46 represents the red pixel electrode in the fourth row and the sixth column, B47 represents the blue pixel electrode in the fourth row and the seventh column, G48 represents the green pixel electrode in the fourth row and the eighth column, R49 represents the red pixel electrode in the fourth row and the ninth column, B410 represents the blue pixel electrode in the fourth row and the tenth column, G411 represents the green pixel electrode in the fourth row and the eleventh column, R412 represents the red pixel electrode in the fourth row and the twelfth column, and B413 represents the blue pixel electrode in the fourth row and the thirteenth column.

Figure 9:
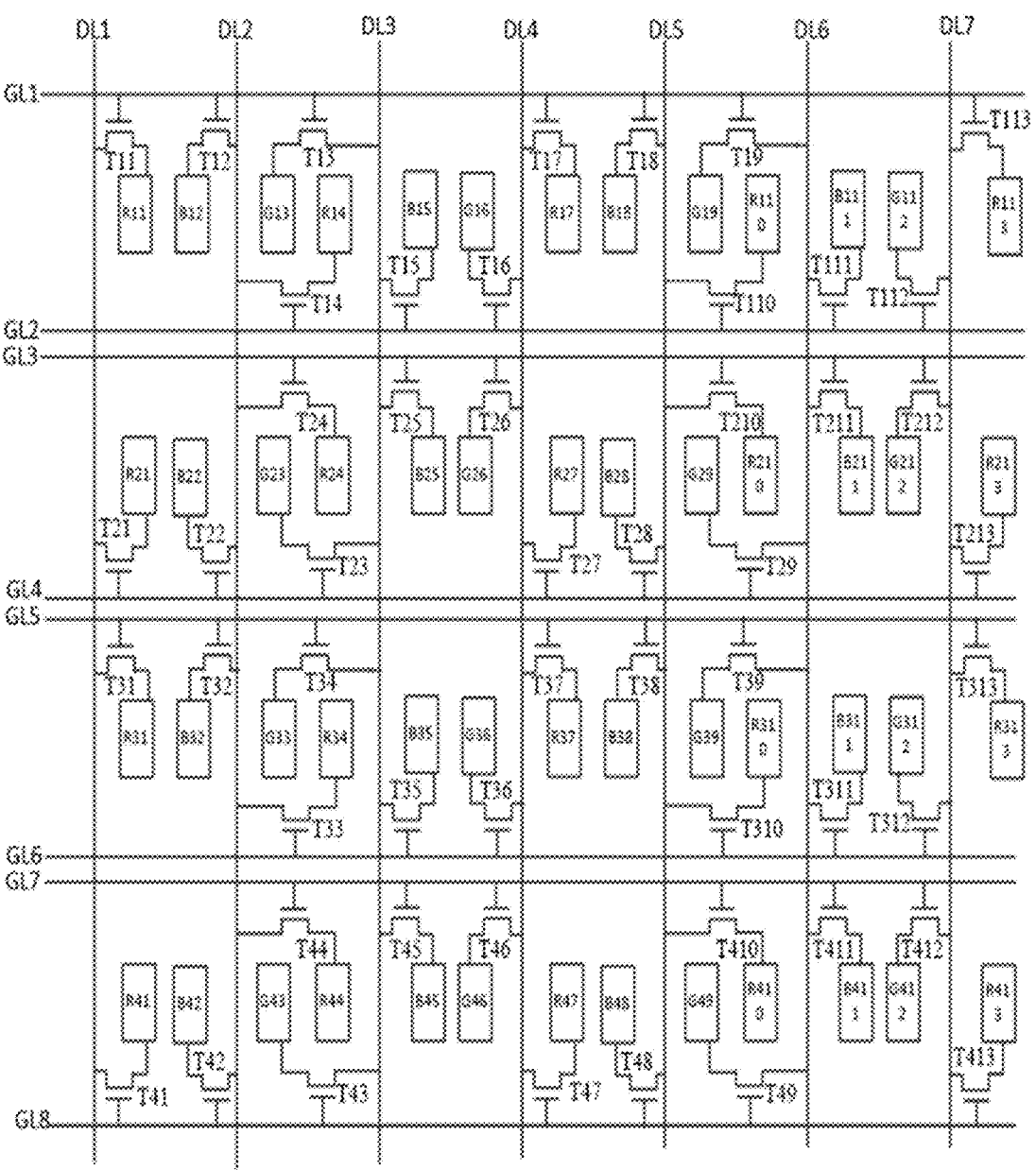
FIG. 9 is a structural view of the pixel structure according to at least one embodiment of the present disclosure.

As shown in FIG. 9, the red subpixel in the first row and the first column includes a red pixel electrode R11 in the first row and the first column and a switching transistor T11 in the first row and the first column. A gate electrode of T11 is electrically coupled to GL1, a source electrode of T11 is electrically coupled to DL1, and a drain electrode of T11 is electrically coupled to R11.

The blue subpixel in the first row and the second column includes a blue pixel electrode B12 in the first row and the second column and a switching transistor T12 in the first row and the second column. A gate electrode of T12 is electrically coupled to GL1, a source electrode of T12 is electrically coupled to DL2, and a drain electrode of T12 is electrically coupled to B12.

The green subpixel in the first row and the third column includes a green pixel electrode G13 in the first row and the third column and a switching transistor T13 in the first row and the third column. A gate electrode of T13 is electrically coupled to GL1, a source electrode of T13 is electrically coupled to DL3, and a drain electrode of T13 is electrically coupled to G13.

The red subpixel in the first row and the fourth column includes a red pixel electrode R14 in the first row and the fourth column and a switching transistor T14 in the first row and the fourth column. A gate electrode of T14 is electrically coupled to GL2, a source electrode of T14 is electrically coupled to DL2, and a drain electrode of T14 is electrically coupled to R14.

The blue subpixel in the first row and the fifth column includes a blue pixel electrode B15 in the first row and the fifth column and a switching transistor T15 in the first row and the fifth column. A gate electrode of T15 is electrically coupled to GL2, a source electrode of T15 is electrically coupled to DL3, and a drain electrode of T15 is electrically coupled to B15.

The green subpixel in the first row and the sixth column includes a green pixel electrode G16 in the first row and the sixth column and a switching transistor T16 in the first row and the sixth column. A gate electrode of T16 is electrically coupled to GL2, a source electrode of T16 is electrically coupled to DL4, and a drain electrode of T16 is electrically coupled to G16. The connection relationship about the other subpixels in the first row may refer to FIG. 9, and thus will not be particularly defined herein.

In FIG. 9, R17 represents the red pixel electrode in the first row and the seventh column, B18 represents the blue pixel electrode in the first row and the eighth column, G19 represents the green pixel electrode in the first row and the ninth column, R110 represents the red pixel electrode in the first row and the tenth column, B111 represents the blue pixel electrode in the first row and the eleventh column, G112 represents the green pixel electrode in the first row and the twelfth column, and R113 represents the red pixel electrode in the first row and the thirteenth column.

The red subpixel in the second row and the first column includes a red pixel electrode R21 in the second row and the first column and a switching transistor T21 in the second row and the first column. A gate electrode of T21 is electrically coupled to GL4, a source electrode of T21 is electrically coupled to DL1, and a drain electrode of T21 is electrically coupled to R21.

The blue subpixel in the second row and the second column includes a blue pixel electrode B22 in the second row and the second column and a switching transistor T22 in the second row and the second column. A gate electrode of T22 is electrically coupled to GL4, a source electrode of T22 is electrically coupled to DL2, and a drain electrode of T22 is electrically coupled to B22.

The green subpixel in the second row and the third column includes a green pixel electrode G23 in the second row and the third column and a switching transistor T23 in the second row and the third column. A gate electrode of T23 is electrically coupled to GL4, a source electrode of T23 is electrically coupled to DL3, and a drain electrode of T23 is electrically coupled to G23.

The red subpixel in the second row and the fourth column includes a red pixel electrode R24 in the second row and the fourth column and a switching transistor T24 in the second row and the fourth column. A gate electrode of T24 is electrically coupled to GL3, a source electrode of T24 is electrically coupled to DL2, and a drain electrode of T24 is electrically coupled to R24.

The blue subpixel in the second row and the fifth column includes a blue pixel electrode B25 in the second row and the fifth column and a switching transistor T25 in the second row and the fifth column. A gate electrode of T25 is electrically coupled to GL3, a source electrode of T25 is electrically coupled to DL3, and a drain electrode of T25 is electrically coupled to B25.

The green subpixel in the second row and the sixth column includes a green pixel electrode G26 in the second row and the sixth column and a switching transistor T26 in the second row and the sixth column. A gate electrode of T26 is electrically coupled to GL3, a source electrode of T26 is electrically coupled to DL4, and a drain electrode of T26 is electrically coupled to G26. The connection relationship about the other subpixels in the second row may refer to FIG. 9, and thus will not be particularly defined herein. In addition, the connection relationship about the subpixels in the third row and the fourth row may specifically refer to FIG. 9, and thus will not be particularly defined herein.

In FIG. 9, R27 represents a red pixel electrode in the second row and the seventh column, B28 represents a blue pixel electrode in the second row and the eighth column, G29 represents a green pixel electrode in the second row and the ninth column, R210 represents a red pixel electrode in the second row and the tenth column, B211 represents a blue pixel electrode in the second row and the eleventh column, G212 represents a green pixel electrode in the second row and the twelfth column, and R213 represents a red pixel electrode in the second row and the thirteenth column.

R31 represents a red pixel electrode in the third row and the first column, B32 represents a blue pixel electrode in the third row and the second column, G33 represents a green pixel electrode in the third row and the third column, R34 represents a red pixel electrode in the third row and the fourth column, B35 represents a blue pixel electrode in the third row and the fifth column, G36 represents a green pixel electrode in the third row and the sixth column, R37 represents a red pixel electrode in the third row and the seventh column, B38 represents a blue pixel electrode in the third row and the eighth column, G39 represents a green pixel electrode in the third row and the ninth column, R310 represents a red pixel electrode in the third row and the tenth column, B311 represents a blue pixel electrode in the third row and the eleventh column, G312 represents a green pixel electrode in the third row and the twelfth column, and R313 represents a red pixel electrode in the third row and the thirteenth column.

R41 represents a red pixel electrode in the fourth row and the first column, B42 represents a blue pixel electrode in the fourth row and the second column, G43 represents a green pixel electrode in the fourth row and the third column, R44 represents a red pixel electrode in the fourth row and the fourth column, B45 represents a blue pixel electrode in the fourth row and the fifth column, G46 represents a green pixel electrode in the fourth row and the sixth column, R47 represents a red pixel electrode in the fourth row and the seventh column, B48 represents a blue pixel electrode in the fourth row and the eighth column, G49 represents a green pixel electrode in the fourth row and the ninth column, R410 represents a red pixel electrode in the fourth row and the tenth column, B411 represents a blue pixel electrode in the fourth row and the eleventh column, G412 represents a green pixel electrode in the fourth row and the twelfth column, and R413 represents a red pixel electrode in the fourth row and the thirteenth column.

Figure 10:
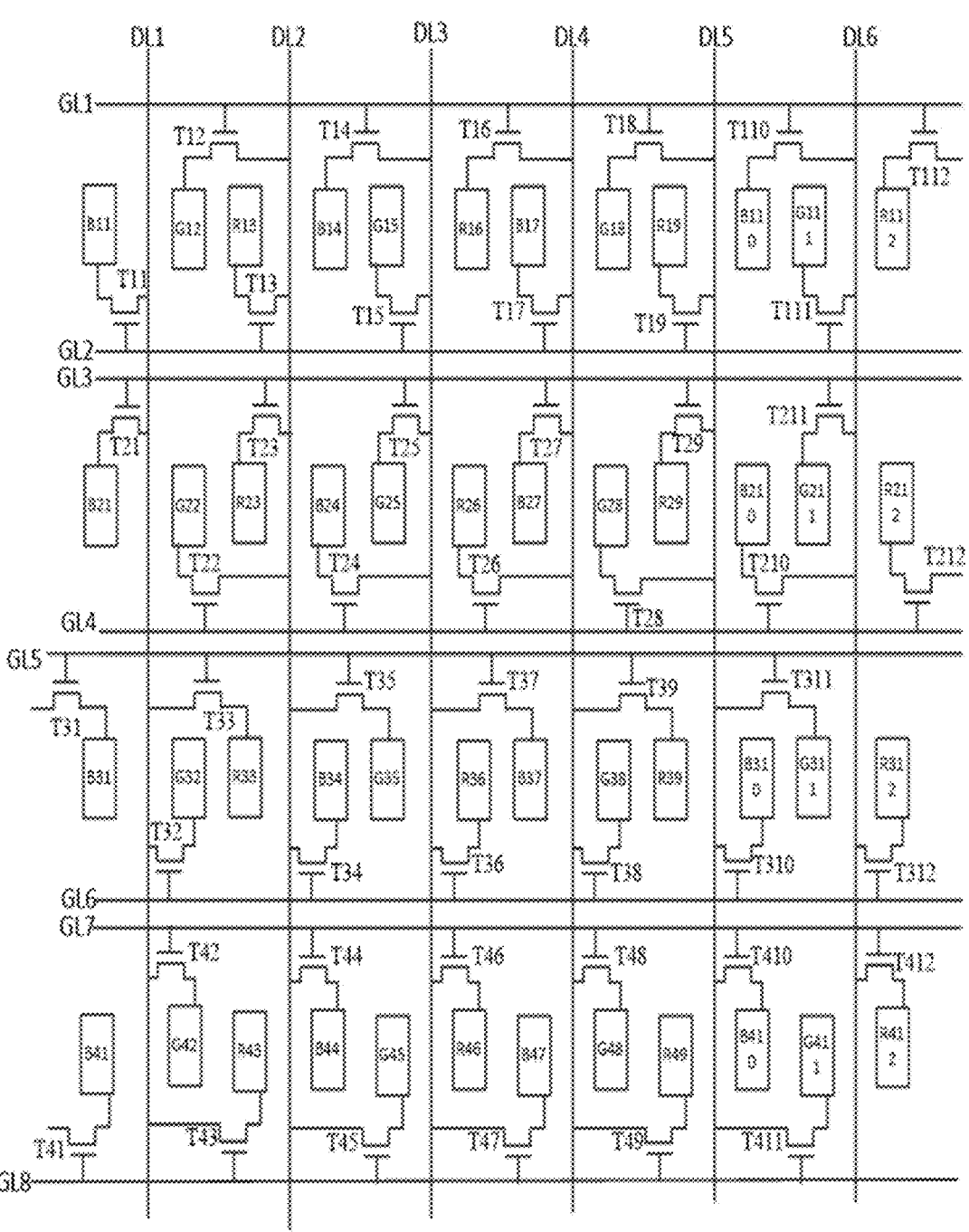
FIG. 10 is a structural view of the pixel structure according to at least one embodiment of the present disclosure.

As shown in FIG. 10, the blue subpixel in the first row and the first column includes a blue pixel electrode B11 in the first row and the first column and a switching transistor T11 in the first row and the first column. A gate electrode of T11 is electrically coupled to GL2, a source electrode of T11 is electrically coupled to DL1, and a drain electrode of T11 is electrically coupled to B11.

The green subpixel in the first row and the second column includes a green pixel electrode G12 in the first row and the second column and a switching transistor T12 in the first row and the second column. A gate electrode of T12 is electrically coupled to GL1, a source electrode T12 is electrically coupled to DL2, and a drain electrode of T12 is electrically coupled to G12.

The red subpixel in the first row and the third column includes a red pixel electrode R13 in the first row and the third column and a switching transistor T13 in the first row and the third column. A gate electrode of T13 is electrically coupled to GL2, a source electrode of T13 is electrically coupled to DL2, and a drain electrode of T13 is electrically coupled to R13.

The blue subpixel in the first row and the fourth column includes a blue pixel electrode B14 in the first row and the fourth column and a switching transistor T14 in the first row and the fourth column. A gate electrode of T14 is electrically coupled to GL1, a source electrode of T14 is electrically coupled to DL3, and a drain electrode of T14 is electrically coupled to B14.

The green subpixel in the first row and the fifth column includes a green pixel electrode G15 in the first row and the fifth column and a switching transistor T15 in the first row and the fifth column. A gate electrode of T15 is electrically coupled to GL2, a source electrode T15 is electrically coupled to DL3, and a drain electrode of T15 is electrically coupled to G15.

The red subpixel in the first row and the sixth column includes a red pixel electrode R16 in the first row and the sixth column and a switching transistor T16 in the first row and the sixth column. A gate electrode of T16 is electrically coupled to GL1, a source electrode of T16 is electrically coupled to DL4, and a drain electrode of T16 is electrically coupled to R16. The connection relationship about the other subpixels in the first row may refer to FIG. 10, and thus will not be particularly defined herein.

A gate electrode of T112 is electrically coupled to GL1, a source electrode of T112 is electrically coupled to DL7, and a drain electrode of T112 is electrically coupled to R112.

The blue subpixel in the second row and the first column includes a blue pixel electrode B21 in the second row and the first column and a switching transistor T21 in the second row and the first column. A gate electrode of T21 is electrically coupled to GL3, a source electrode of T21 is electrically coupled to DL1, and a drain electrode of T21 is electrically coupled to B21.

The green subpixel in the second row and the second column includes a green pixel electrode G22 in the second row and the second column and a switching transistor T22 in the second row and the second column. A gate electrode of T22 is electrically coupled to GL4, a source electrode of T22 is electrically coupled to DL2, and a drain electrode of T22 is electrically coupled to G22.

The red subpixel in the second row and the third column includes a red pixel electrode R23 in the second row and the third column and a switching transistor T23 in the second row and the third column. A gate electrode of T23 is electrically coupled to GL3, a source electrode of T23 is electrically coupled to DL2, and a drain electrode of T23 is electrically coupled to R23.

The blue subpixel in the second row and the fourth column includes a blue pixel electrode B24 in the second row and the fourth column and a switching transistor T24 in the second row and the fourth column. A gate electrode of T24 is electrically coupled to GL4, a source electrode of T24 is electrically coupled to DL3, and a drain electrode of T24 is electrically coupled to B24. The connection relationship about the other subpixels in the second row may refer to FIG. 10, and thus will not be particularly defined herein.

The blue subpixel in the third row and the first row includes a blue pixel electrode B31 in the third row and the first column and a switching transistor T31 in the third row and the first column, a gate electrode of T31 is electrically coupled to GL5, and a drain electrode of T31 is electrically coupled to B31.

The green subpixel in the third row and the second column includes a green pixel electrode G32 in the third row and the second row and a switching transistor T32 in the second row and the second column. A gate electrode of T32 is electrically coupled to GL6, a source electrode of T32 is electrically coupled to DL1, and a drain electrode of T32 is electrically coupled to G32.

The red subpixel in the third row and the third column includes a red pixel electrode R33 in the third row and the third column and a switching transistor T33 in the third row and the third column. A gate electrode of T33 is electrically coupled to GL5, a source electrode of T33 is electrically coupled to DL1, and a drain electrode of T33 is electrically coupled to R33.

The blue subpixel in the third row and the fourth column includes a blue pixel electrode B34 in the third row and the fourth column and a switching transistor T34 in the third row and the fourth column. A gate electrode of T34 is electrically coupled to GL6, a source electrode of T34 is electrically coupled to DL2, and a drain electrode of T34 is electrically coupled to B34. The connection relationship about the other subpixels in the third row may refer to FIG. 10, and thus will not be particularly defined herein.

The blue subpixel in the fourth row and the first column includes a blue pixel electrode B41 in the fourth row and the first column and a switching transistor T41 in the fourth row and the first column. A gate electrode of T41 is electrically coupled to GL8, and a drain electrode of T41 is electrically coupled to B41.

The green subpixel in the fourth row and the second column includes a green pixel electrode G42 in the fourth row and the second column and a switching transistor T42 in the fourth row and the second column. A gate electrode of T42 is electrically coupled to GL7, a source electrode of T42 is electrically coupled to DL1, and a drain electrode of T42 is electrically coupled to G42.

The red subpixel in the fourth row and the third column includes a red pixel electrode R43 in the fourth row and the third column and a switching transistor T43 in the fourth row and the third column. A gate electrode of T43 is electrically coupled to GL8, a source electrode of T43 is electrically coupled to DL1, and a drain electrode of T43 is electrically coupled to R43.

The blue subpixel in the fourth row and the fourth column includes a blue pixel electrode B44 in the fourth row and the fourth column and a switching transistor T44 in the fourth row and the fourth column. A gate electrode of T44 is electrically coupled to GL7, a source electrode of T44 is electrically coupled to DL2, and a drain electrode of T44 is electrically coupled to B44. The connection relationship about the other subpixels in the fourth row may refer to FIG. 10, and thus will not be particularly defined herein.

Figure 11:
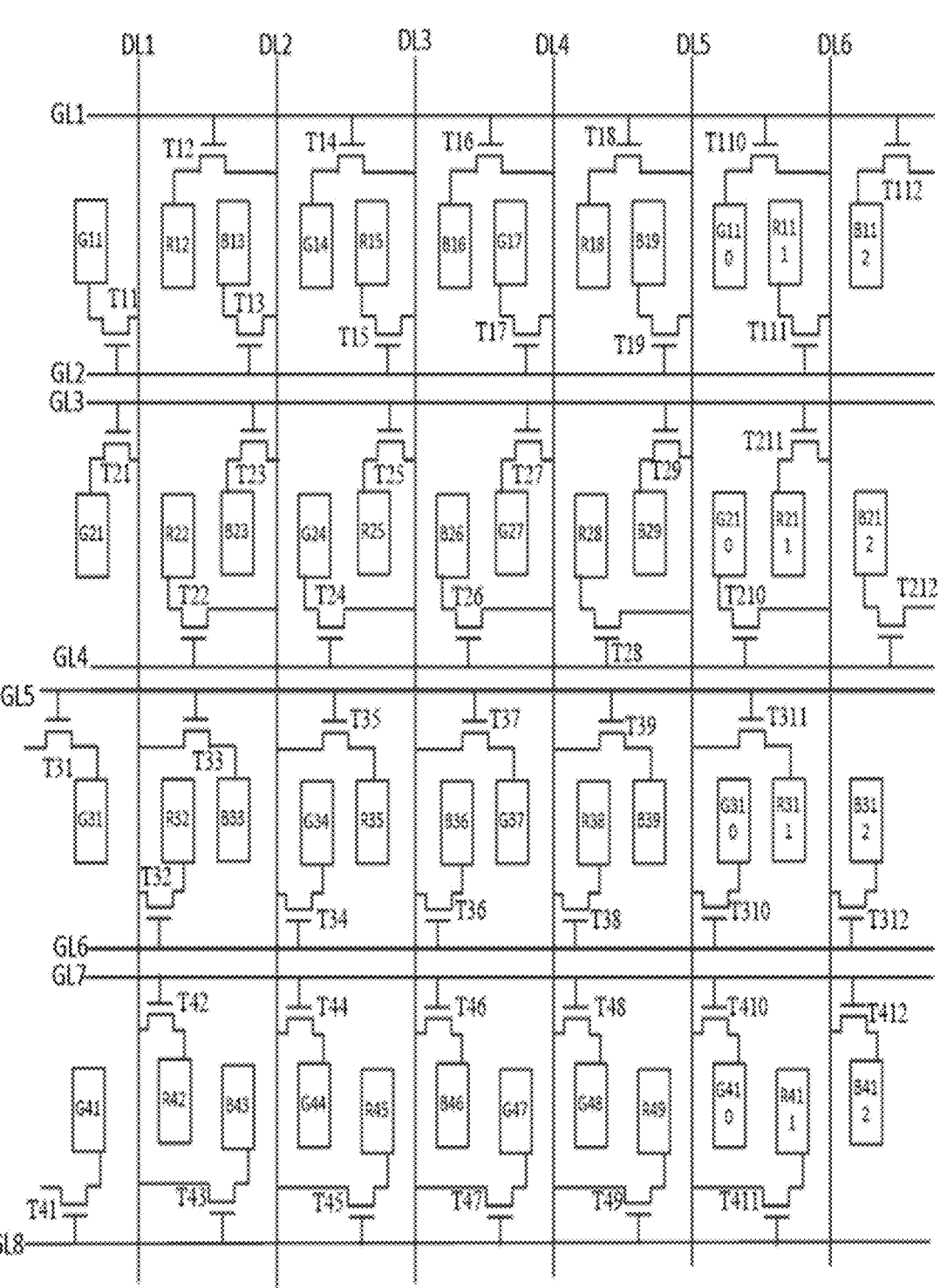
FIG. 11 is a structural view of the pixel structure according to at least one embodiment of the present disclosure.

As shown in FIG. 11, the green subpixel in the first row and the first column includes a green pixel electrode G11 in the first row and the first column and a switching transistor in the first row and the first column. A gate electrode of T11 is electrically coupled to GL2, a source electrode of T11 is electrically coupled to DL1, and a drain electrode of T11 is electrically coupled to G11.

The red subpixel in the first row and the second column includes a red pixel electrode R12 in the first row and the second column and a switching transistor T12 in the first row and the second column. A gate electrode of T12 is electrically coupled to GL1, a source electrode of T12 is electrically coupled to DL2, and a drain electrode of T12 is electrically coupled to R12.

The blue subpixel in the first row and the third column includes a blue pixel electrode B13 in the first row and the third column and a switching transistor T13 in the first row and the third column. A gate electrode of T13 is electrically coupled to GL2, a source electrode of T13 is electrically coupled to DL2, and a drain electrode of T13 is electrically coupled to B13.

The green subpixel in the first row and the fourth column includes a green pixel electrode in the first row and the fourth column and a switching transistor T14 in the first row and the fourth column. A gate electrode of T14 is electrically coupled to GL1, a source electrode of T14 is electrically coupled to DL3, and a drain electrode of T14 is electrically coupled to G14.

The red subpixel in the first row and the fifth column includes a red pixel electrode R15 in the first row and the fifth column and a switching transistor T15 in the first row and the fifth column. A gate electrode of T15 is electrically coupled to GL2, a source electrode of T15 is electrically coupled to DL3, and a drain electrode of T15 is electrically coupled to R15.

The blue subpixel in the first row and the sixth column includes a blue pixel electrode B16 in the first row and the sixth column and a switching transistor T16 in the first row and the sixth column. A gate electrode of T16 is electrically coupled to GL1, a source electrode of T16 is electrically coupled to DL4, and a drain electrode of T16 is electrically coupled to B16. The connection relationship about the other subpixels in the first row may refer to FIG. 11, and thus will not be particularly defined herein.

In FIG. 11, G17 represents a green pixel electrode in the first row and the seventh column, R18 represents a red pixel electrode in the first row and the eighth column, B19 represents a blue pixel electrode in the first row and the ninth column, G110 represents a green pixel electrode in the first row and the tenth column, R111 represents a red pixel electrode in the first row and the eleventh column, and B112 represents a blue pixel electrode in the first row and the twelfth column.

The green subpixel in the second row and the first column includes a green pixel electrode G21 in the second row and the first column and a switching transistor T21 in the second row and the first column. A gate electrode of T21 is electrically coupled to GL3, a source electrode of T21 is electrically coupled to DL1, and a drain electrode of T21 is electrically coupled to G21.

The red subpixel in the second row and the second column includes a red pixel electrode R22 in the second row and the second column and a switching transistor T22 in the second row and the second column. A gate electrode of T22 is electrically coupled to GL4, a source electrode of T22 is electrically coupled to DL2, and a drain electrode of T22 is electrically coupled to R22.

The blue subpixel in the second row and the third column includes a blue pixel electrode B23 in the second row and the third column and a switching transistor T23 in the second row and the third column. A gate electrode of T23 is electrically coupled to GL3, a source electrode of T23 is electrically coupled to DL2, and a drain electrode of T23 is electrically coupled to B23.

The green subpixel in the second row and the fourth column includes a green pixel electrode G24 in the second row and the fourth column and a switching transistor T24 in the second row and the fourth column. A gate electrode of T24 is electrically coupled to GL4, a source electrode of T14 is electrically coupled to DL3, and a drain electrode of T24 is electrically coupled to G24. The connection relationship about the other subpixels in the second row may refer to FIG. 11, and thus will not be particularly defined herein.

In FIG. 11, R25 represents a red pixel electrode in the second row and the fifth column, B26 represents a blue pixel electrode in the second row and the sixth column, G27 represents a green pixel electrode in the second row and the seventh column, R28 represents a red pixel electrode in the second row and the eighth column, B29 represents a blue pixel electrode in the second row and the ninth column, G210 represents a green pixel electrode in the second row and the tenth column, R211 represents a red pixel electrode in the second row and the eleventh column, and B212 represents a blue pixel electrode in the second row and the twelfth column.

The red subpixel in the third row and the second column includes a red pixel electrode R32 in the third row and the second column and a switching transistor T32 in the third row and the second column. A gate electrode of T32 is electrically coupled to GL6, a source electrode of T32 is electrically coupled to DL1, and a drain electrode of T32 is electrically coupled to R32.

The blue subpixel in the third row and the third column includes a blue pixel electrode B33 in the third row and the third column and a switching transistor T33 in the third row and the third column. A gate electrode of T33 is electrically coupled to GL5, a source electrode of T33 is electrically coupled to DL1, and a drain electrode of T33 is electrically coupled to B33.

The green subpixel in the third row and the fourth column includes a green pixel electrode G34 in the third row and the fourth column and a switching transistor T34 in the third row and the fourth column. A gate electrode of T34 is electrically coupled to GL6, a source electrode of T34 is electrically coupled to DL2, and a drain electrode of T34 is electrically coupled to G34. The connection relationship about the other subpixels in the third row may refer to FIG. 11, and thus will not be particularly defined herein.

In FIG. 11, R35 represents a red pixel electrode in the third row and the fifth column, B36 represents a blue pixel electrode in the third row and the sixth column, G37 represents a green pixel electrode in the third row and the seventh column, R38 represents a red pixel electrode in the third row and the eighth column, B39 represents a blue pixel electrode in the third row and the ninth column, G310 represents a green pixel electrode in the third row and the tenth column, R311 represents a red pixel electrode in the third row and the eleventh column, and B312 represents a blue pixel electrode in the third row and the twelfth column.

The red subpixel in the fourth row and the second column includes a red pixel electrode R42 in the fourth row and the second column and a switching transistor T42 in the fourth row and the second column. A gate electrode of T42 is electrically coupled to GL7, a source electrode of T42 is electrically coupled to DL1, and a drain electrode of T42 is electrically coupled to R42.

The blue subpixel in the fourth row and the third column includes a blue pixel electrode B43 in the fourth row and the third column and a switching transistor T43 in the fourth row and the third column. A gate electrode of T43 is electrically coupled to GL8, a source electrode of T43 is electrically coupled to DL1, and a drain electrode of T43 is electrically coupled to B43. The connection relationship about the other subpixels in the fourth row may refer to FIG. 11, and thus will not be particularly defined herein.

In FIG. 11, G44 represents a green pixel electrode in the fourth row and the fourth column, R45 represents a red pixel electrode in the fourth row and the fifth column, B46 represents a blue pixel electrode in the fourth row and the sixth column, G47 represents a green pixel electrode in the fourth row and the seventh column, R48 represents a red pixel electrode in the fourth row and the eighth column, B49 represents a blue pixel electrode in the fourth row and the ninth column, G410 represents a green pixel electrode in the fourth row and the tenth column, R411 represents a red pixel electrode in the fourth row and the eleventh column, and B412 represents a blue pixel electrode in the fourth row and the twelfth column.

The present disclosure further provides in some embodiments a driving method for the above-mentioned pixel structure, which includes simultaneously enabling two gate lines arranged between two adjacent rows of subpixels, so as to control subpixels electrically coupled to the two gate lines to receive a data voltage on a corresponding data line.

During the implementation, the two gate lines between two adjacent rows of subpixels form a gate line group, and a plurality of gate line groups are enabled sequentially to control the subpixel to receive the data voltage on a corresponding data line.

In at least one embodiment of the present disclosure, the driving method includes enabling at least a part of rows of subpixels to display a black image, and enabling at least a part of columns of subpixels to display the black image. At least one row of subpixels adjacent to a row of subpixels for displaying the black image include a subpixel for displaying the black image and subpixels for displaying at least three colors, so as to enable an edge to be grayish in a case that a part of the image is displayed, thereby to improve a display effect.

In a possible embodiment of the present disclosure, the subpixels for displaying at least three colors are subpixels adjacent to each other, or the subpixel for displaying the black image is arranged between the subpixels adjacent to each other in the subpixels for displaying at least three colors.

The present disclosure further provides in some embodiments a display substrate which includes the above-mentioned pixel structure.

The above are merely the embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. A pixel structure, comprising a pixel module, a plurality of gate lines and a plurality of data lines, wherein the pixel module comprises subpixels having A colors, where A is an integer greater than or equal to 3;

the pixel module comprises subpixels arranged in rows and columns;

two gate lines are arranged between two adjacent rows of subpixels, and two columns of subpixels are arranged between two data lines; and in two columns of subpixels, at least two subpixels having a same color and electrically coupled to the two gate lines are electrically coupled to a same data line, wherein in the two columns of subpixels, the at least two subpixels comprises a pixel electrode and a switching transistor, a gate electrode of the switching transistor is electrically coupled to a corresponding gate line, a first electrode of the switching transistor is electrically coupled to the same corresponding data line, and a second electrode of the switching transistor is electrically coupled to the pixel electrode.

2. The pixel structure according to claim 1, wherein the subpixels in a same column in the pixel module have a same color, and the subpixels in two columns arranged between two data lines have different colors;

the pixel structure comprises N gate lines and a plurality of data lines, where N is an integer greater than 1;

a $(2n)^{th}$ gate line and a $(2n+1)^{th}$ gate line are arranged between an $n^{th}$ row of subpixels and an $(n+1)^{th}$ row of subpixels, where n is a positive integer; and in the two columns of subpixels arranged between two adjacent data lines, subpixels that are in adjacent rows and have a same color are electrically coupled to a same data line, at least a part of subpixels in the $n^{th}$ row are electrically coupled to the $(2n)^{th}$ gate line, and at least a part of subpixels in the $(n+1)^{th}$ row are electrically coupled to the $(2n+1)^{th}$ gate line.

3. The pixel structure according to claim 2, wherein the subpixels in a first row and even-numbered columns are electrically coupled to a first gate line, and the subpixel in the first row and a $(2m)^{th}$ column is electrically coupled to an $m^{th}$ data line, where m is a positive integer; and the subpixels in a last row and the even-numbered columns are electrically coupled to a last gate line, and the subpixel in the last row and the $(2m)^{th}$ column is electrically coupled to the $m^{th}$ data line.

4. The pixel structure according to claim 2, wherein the subpixels in a $(3a-2)^{th}$ column are subpixels having a first color, the subpixels in a $(3a-1)^{th}$ column are subpixels having a second color, and the subpixels in a $(3a)^{th}$ column are subpixels having a third color, where a is a positive integer; or the subpixels in the $(3a-2)^{th}$ column are subpixels having the third color, the subpixels in the $(3a-1)^{th}$ column are subpixels having the second color, and the subpixels in the $(3a)^{th}$ column are subpixels having the first color; or the subpixels in the $(3a-2)^{th}$ column are subpixels having the first color, the subpixels in the $(3a-1)^{th}$ column are subpixels having the third color, and the subpixels in the $(3a)^{th}$ column are subpixels having the second color.

5. The pixel structure according to claim 1, wherein the subpixels in a same column in the pixel module have a same color, and the subpixels in two columns arranged between two data lines have different colors;

the pixel structure comprises N gate lines and a plurality of data lines, where N is an integer greater than 1;

a $(2n)^{th}$ gate line and a $(2n+1)^{th}$ gate line are arranged between an $n^{th}$ row of subpixels and an $(n+1)^{th}$ row of subpixels, where n is a positive integer;

in the subpixels arranged between a $(3b-2)^{th}$ data line and a $(3b-1)^{th}$ data line, the subpixels in a same row are electrically coupled to a same gate line, and the subpixels in a same row are electrically coupled to the $(3b-2)^{th}$ data line and the $(3b-1)^{th}$ data line respectively;

in the subpixels arranged between a $(3b)^{th}$ data line and a $(3b+1)^{th}$ data line, the subpixels in a same row are electrically coupled to a same gate line, and the subpixels in a same row are electrically coupled to the $(3b)^{th}$ data line and the $(3b+1)^{th}$ data line respectively; and in the subpixels arranged between the $(3b-1)^{th}$ data line and the $(3b)^{th}$ data line, the subpixels in a same row are electrically coupled to different gate lines, and the subpixels in a same row are electrically coupled to the $(3b-1)^{th}$ data line and the $(3b)^{th}$ data line respectively, where b is a positive integer.

6. The pixel structure according to claim 5, wherein the subpixels in a $(2c-1)^{th}$ row arranged between the $(3b-2)^{th}$ data line and the $(3b-1)^{th}$ data line are electrically coupled to a $(4c-3)^{th}$ gate line, where c is a positive integer; and the subpixels in a $(2c)^{th}$ row arranged between the $(3b-2)^{th}$ data line and the $(3b-1)^{th}$ data line are electrically coupled to a $(4c)^{th}$ gate line.

7. The pixel structure according to claim 5, wherein in the subpixels in a $(2c-1)^{th}$ row arranged between the $(3b-1)^{th}$ data line and the $(3b)^{th}$ data line, the subpixel in an odd-numbered column is electrically coupled to a $(4c-3)^{th}$ gate line, and the subpixel in an even-numbered column is electrically coupled to a $(4c-2)^{th}$ gate line, where c is a positive integer; and in the subpixels in a $(2c)^{th}$ row arranged between a $(4b-2)^{th}$ data line and a $(4b-1)^{th}$ data line, the subpixel in an odd-numbered column is electrically coupled to the $(4b-1)^{th}$ data line and a $(4c)^{th}$ gate line, and the subpixel in an even-numbered column is electrically coupled to the $(4b-2)^{th}$ data line and a $(4c-1)^{th}$ gate line.

8. The pixel structure according to claim 5, wherein the subpixels in a $(2c-1)^{th}$ row arranged between the $(3b)^{th}$ data line and the $(3b+1)^{th}$ data line are electrically coupled to a $(4c-2)^{th}$ gate line, and the subpixels in a $(2c)^{th}$ row arranged between the $(3b)^{th}$ data line and the $(3b+1)^{th}$ data line are electrically coupled to a $(4c-1)^{th}$ gate line, where c is a positive integer.

9. The pixel structure according to claim 1, wherein the subpixels in a same column in the pixel module have a same color, and the subpixels in two columns arranged between two data lines have different colors;

the pixel structure comprises N gate lines and a plurality of data lines, where N is an integer greater than 1; an $(8n-6)^{th}$ gate line and an $(8n-5)^{th}$ gate line are arranged between a $(4n-3)^{th}$ row of subpixels and a $(4n-2)^{th}$ row of subpixels, where n is a positive integer;

in the subpixels in the $(4n-3)^{th}$ row and the subpixels in the $(4n-2)^{th}$ row, the subpixels that are in a same column and electrically coupled to the $(8n-6)^{th}$ gate line and the $(8n-5)^{th}$ gate line and have a same color are electrically coupled to a same data line;

an $(8n-2)^{th}$ gate line and an $(8n-1)^{th}$ gate line are arranged between a $(4n-1)^{th}$ row of subpixels and a $(4n)^{th}$ row of subpixels; and in the subpixels in the $(4n-1)^{th}$ row and the subpixels in the $(4n)^{th}$ row, the subpixels that are in a same column and electrically coupled to the $(8n-2)^{th}$ gate line and the $(8n-1)^{th}$ gate line and have a same color are electrically coupled to a same data line.

10. The pixel structure according to claim 9, wherein in the subpixels in the $(4n-3)^{th}$ row, two subpixels having different colors are arranged between a $d^{th}$ data line and a $(d+1)^{th}$ data line, one of the two subpixels having different colors is electrically coupled to an $(8n-7)^{th}$ gate line and the $(d+1)^{th}$ data line, and the other of the two subpixels having different colors is electrically coupled to an $(8n-6)^{th}$ gate line and the $(d+1)^{th}$ data line, where d is a positive integer.

11. The pixel structure according to claim 9, wherein an $(8n-4)^{th}$ gate line and an $(8n-3)^{th}$ gate line are arranged between the $(4n-2)^{th}$ row of subpixels and the $(4n-1)^{th}$ row of subpixels; and in the subpixels in the $(4n-2)^{th}$ row, two subpixels having different colors are arranged between a $d^{th}$ data line and a $(d+1)^{th}$ data line, one of the two subpixels having different colors is electrically coupled to the $(8n-4)^{th}$ gate line and the $(d+1)^{th}$ data line, and the other of the two subpixels having different colors is electrically coupled to the $(8n-3)^{th}$ gate line and the $(d+1)^{th}$ data line, where d is a positive integer.

12. The pixel structure according to claim 9, wherein an $(8n-4)^{th}$ gate line and an $(8n-3)^{th}$ gate line are arranged between the $(4n-2)^{th}$ row of subpixels and the $(4n-1)^{th}$ row of subpixels; and in the subpixels in the $(4n-1)^{th}$ row, two subpixels having different colors are arranged between a $d^{th}$ data line and a $(d+1)^{th}$ data line, one of the two subpixels having different colors is electrically coupled to the $d^{th}$ data line and the $(8n-2)^{th}$ gate line, and the other of the two subpixels having different colors is electrically coupled to the $d^{th}$ data line and the $(8n-3)^{th}$ gate line, where d is a positive integer.

13. The pixel structure according to claim 9, wherein in the subpixels in the $(4n)^{th}$ row, two subpixels having different colors are arranged between a $d^{th}$ data line and a $(d+1)^{th}$ data line, one of the two subpixels having different colors is electrically coupled to an $(8n-1)^{th}$ gate line and the $d^{th}$ data line, and the other of the two subpixels having different colors is electrically coupled to an $(8n)^{th}$ gate line and the $d^{th}$ data line, where d is a positive integer.

14. The pixel structure according to claim 1, further comprising a gate line arranged at a first side of a first row of subpixels and a gate line arranged at a second side of a last row of subpixels, wherein the first side is a side of the first row of subpixels distal to a second row of subpixels, the second side is a side of the last row of subpixels distal to a second last row of subpixels, and the first side is opposite to the second side.

15. A driving method, for a pixel structure according to claim 1, comprising simultaneously enabling two gate lines arranged between two adjacent rows of subpixels, to control subpixels electrically coupled to the two gate lines to receive a data voltage on a corresponding data line.

16. The driving method according to claim 15, wherein the two gate lines between two adjacent rows of subpixels form a gate line group, and a plurality of gate line groups is enabled sequentially to control the subpixel to receive the data voltage on the corresponding data line.

17. The driving method according to claim 15, further comprising enabling at least a part of rows of subpixels to display a black image, and enabling at least a part of columns of subpixels to display the black image, wherein at least one row of subpixels adjacent to a row of subpixels for displaying the black image comprise a subpixel for displaying the black image and subpixels for displaying at least three colors.

18. A driving method according to claim 17, wherein the subpixels for displaying at least three colors are subpixels adjacent to each other, or the subpixel for displaying the black image is arranged between the subpixels adjacent to each other in the subpixels for displaying at least three colors.

19. A display substrate, comprising a pixel structure a pixel structure, wherein the pixel structure comprises a pixel module, a plurality of gate lines and a plurality of data lines, wherein the pixel module comprises subpixels having A colors, where A is an integer greater than or equal to 3;

the pixel module comprises subpixels arranged in rows and columns;

two gate lines are arranged between two adjacent rows of subpixels, and two columns of subpixels are arranged between two data lines; and in two columns of subpixels, at least two subpixels having a same color and electrically coupled to the two gate lines are electrically coupled to a same data line, wherein in the two columns of subpixels, the at least two subpixels comprises a pixel electrode and a switching transistor, a gate electrode of the switching transistor is electrically coupled to a corresponding gate line, a first electrode of the switching transistor is electrically coupled to the same corresponding data line, and a second electrode of the switching transistor is electrically coupled to the pixel electrode.

\* \* \* \* \*